United States Patent [19]

Searls

[11] Patent Number: 5,333,277

[45] Date of Patent: Jul. 26, 1994

[54] DATA BUSS INTERFACE AND EXPANSION SYSTEM

[75] Inventor: Ronald C. Searls, Dade City, Fla.

[73] Assignee: Exportech Trading Company

[21] Appl. No.: 819,202

[22] Filed: Jan. 10, 1992

[51] Int. Cl.$^5$ ............................................. G06F 13/42
[52] U.S. Cl. ............................. 395/325; 364/DIG. 2; 364/927.93; 364/935.46; 364/935.48; 364/940.81; 364/951.3
[58] Field of Search ............... 395/325, 500, 200, 275; 364/715.02

[56] References Cited

U.S. PATENT DOCUMENTS

| | | | |
|---|---|---|---|
| 5,006,981 | 4/1991 | Beltz et al. | 395/325 |
| 5,101,478 | 3/1992 | Fu et al. | 395/275 |
| 5,123,092 | 6/1992 | Buxton et al. | 395/250 |
| 5,129,036 | 7/1992 | Dean et al. | 395/2 |
| 5,138,703 | 8/1992 | Igarashi | 395/325 |
| 5,148,389 | 9/1992 | Hughes | 395/800 |
| 5,218,681 | 6/1993 | Gephardt et al. | 395/325 |

*Primary Examiner*—Debra A. Chun
*Attorney, Agent, or Firm*—Dykema Gossett

[57] ABSTRACT

A Buss Interface and Expansion System, which attaches to a SCSI buss provides, means for increasing the number of devices which can be attached to the buss, provides means for data compressing and decompressing data, and means for use by a host computer attached to the SCSI buss for allowing existing SCSI drives to expand their storage capacity. The disclosed system also provides means for enabling an attached drive to mirror another attached drive, means for creating virtual drives out of devices attached to the peripheral computer, and means for using RAID algorithms on groups of drives attached to the peripheral computer. The disclosed system provides the aforereferenced features while requiring only minimal modifications to the software running on a host system. Through use of electronically reprogrammable storage means, the disclosed system can be updated and reprogrammed by the host computer. General purpose processor means are included in the disclosed system along with the reprogrammable storage means for expanding the capabilities beyond those implemented in the preferred embodiment. Additional features offered by the disclosed system include data buffering between host and devices attached to the host's data buss, and also include means for providing communication capability between the host and disk drives even when the two use incompatible connectors.

46 Claims, 29 Drawing Sheets

FLOW CHART OF PRESENT INVENTION MAIN LOOP

HOST COMPUTER WITH A MAXIMUM
OF 7 ATTACHED SCSI DEVICES

USE OF PRESENT INVENTION
ALLOWS BUSS DEVICE EXPANSION

DATA COMPRESSION PATHS

BLOCK DIAGRAM OF THE
PREFERRED EMBODIMENT

DECOMPRESSED DATA

COMPRESSED DATA

COMPRESSION PATH THROUGH PRESENT INVENTION USED IN PATH A IN FIGURE 3

DECOMPRESSION PATH THROUGH PRESENT INVENTION USED IN PATH A IN FIGURE 3

DECOMPRESSED DATA

COMPRESSED DATA

COMPRESSION PATH THROUGH PRESENT INVENTION USED IN PATH B IN FIGURE 3

DECOMPRESSED DATA

COMPRESSED DATA

DECOMPRESSION PATH THROUGH PRESENT INVENTION USED IN PATH B IN FIGURE 3

USE OF PRESENT INVENTION TO BUFFER DATA USING DATA PATH A IN FIGURE 3

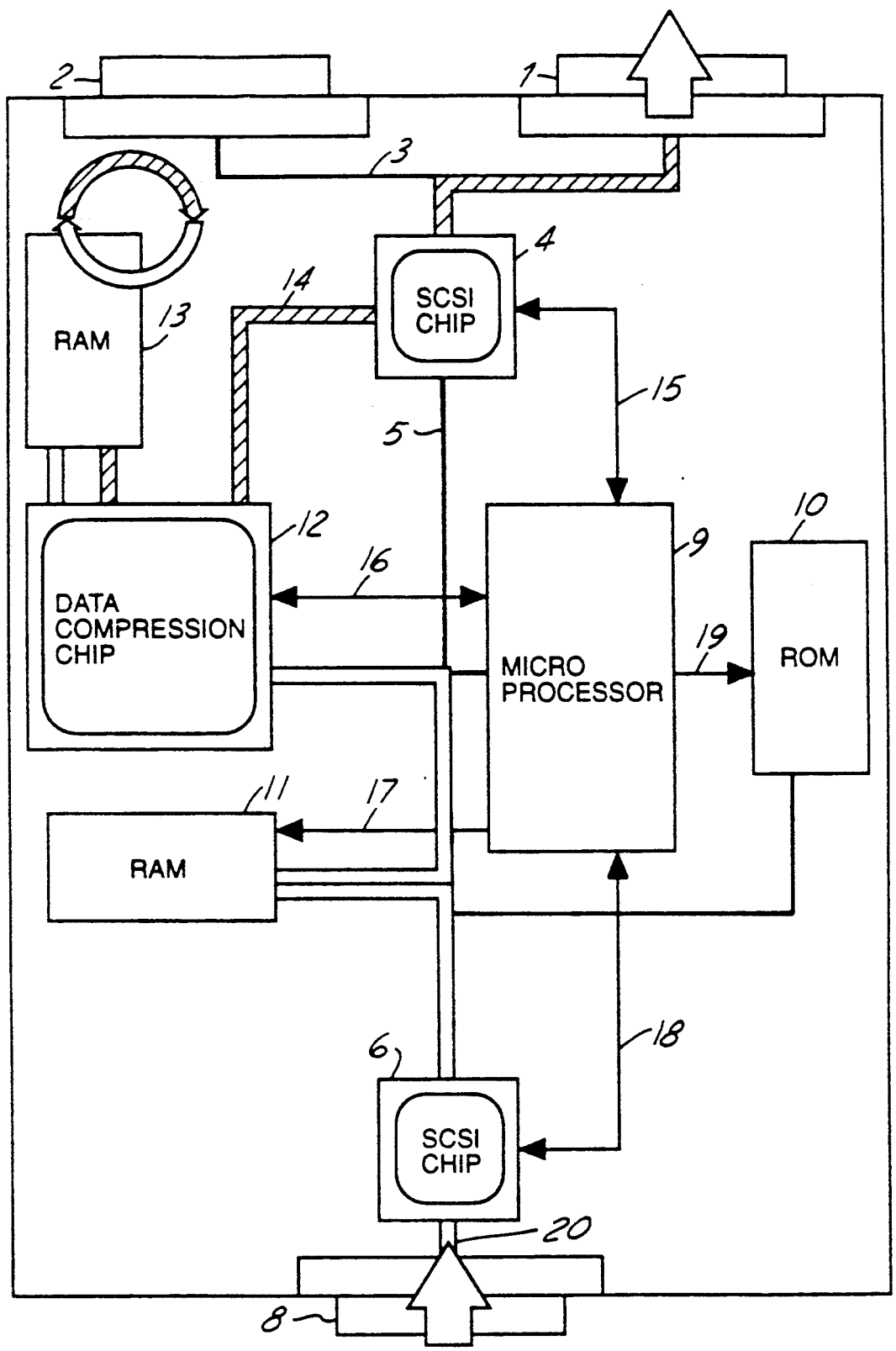
FIG.11 DECOMPRESSION PATH FROM RAID CONFIGURATION THRU PRESENT INVENTION (PATH B IN FIGURE 3)

| BIT BYTE | 7 | 6 | 5 | 4 | 3 | 2 | 1 | 0 |
|---|---|---|---|---|---|---|---|---|
| 0 | OPERATION CODE ||||||||
| 1 | LUN (LOGICAL UNIT NUMBER) ||| LOGICAL BLOCK ADDRESS (MSB) (IF REQUIRED) |||||
| 2 | LOGICAL BLOCK ADDRESS (IF REQUIRED) ||||||||
| 3 | LOGICAL BLOCK ADDRESS (LSB) (IF REQUIRED) ||||||||
| 4 | TRANSFER LENGTH (IF REQUIRED) ||||||||
| 5 | CONTROL BYTE ||||||||

TYPICAL 6-BYTE CONTROL DESCRIPTOR BLOCK (CDB) ACCORDING TO THE SCSI-1 SPECIFICATION

FIG.12A

| 7 | 6 | 5 | 4 | 3 | 2 | 1 | 0 |
|---|---|---|---|---|---|---|---|
| RESERVED |||||| FLAG | LINK |

CONTROL BYTE (BYTE 5 ABOVE) AS DEFINED BY THE SCSI SPECIFICATION

FIG.12B

| BIT BYTE | 7 | 6 | 5 | 4 | 3 | 2 | 1 | 0 |
|---|---|---|---|---|---|---|---|---|
| 0 | OPERATION CODE ||||||||
| 1 | PRIVATE BUSS ID ||| LOGICAL BLOCK ADDRESS (MSB) (IF REQUIRED) |||||
| 2 | LOGICAL BLOCK ADDRESS (IF REQUIRED) ||||||||
| 3 | LOGICAL BLOCK ADDRESS (LSB) (IF REQUIRED) ||||||||
| 4 | TRANSFER LENGTH (IF REQUIRED) ||||||||
| 5 | CONTROL BYTE ||||||||

TYPICAL 6-BYTE CONTROL DESCRIPTOR BLOCK (CDB) WITH LUN REDEFINED BY PRESENT INVENTION

FIG.13A

| 7 | 6 | 5 | 4 | 3 | 2 | 1 | 0 |
|---|---|---|---|---|---|---|---|
| RESERVED |||| START CMPR | STOP CMPR | FLAG | LINK |

CONTROL BYTE AS DEFINED BY PRESENT INVENTION WITH START/CONTINUE COMPRESSION/DECOMPRESSION BIT AND STOP COMPRESSION/DECOMPRESSION BITS DEFINED

FIG.13B

EXAMPLE FLOWCHART OF USE OF PRESENT INVENTION BY A HOST COMPUTER

FLOW CHART OF PRESENT INVENTION MAIN LOOP

CONTROL FLOW OF CONFIGURATION
INITIALIZATION IN PRESENT INVENTION

PRESENT INVENTION INTERNAL SCSI COMMAND PROCESSING

CONTROL FLOW WHEN DOING SECTOR I/O TO THE SECONDARY SCSI BUSS

CONTROL FLOW WHEN READING
FROM THE SECONDARY SCSI BUSS

CONTROL FLOW WHEN WRITING TO
THE SECONDARY SCSI BUSS

FIG. 21 — CONTROL FLOW WHEN COMPRESSING TO A SECONDARY BUSS DEVICE

CONTROL FLOW WHEN DECOMPRESSING
FROM A SECONDARY BUSS DEVICE

CONTROL FLOW WHEN
READING FROM A RAID CONFIGURATION

CONTROL FLOW WHEN WRITING TO A RAID CONFIGURATION

CONTROL FLOW DECOMPRESSING
FROM A RAID CONFIGURATION

| ID | MIRROR ID 0 | MIRROR ID 1 | MIRROR ID 2 | MIRROR ID 3 | MIRROR ID 4 | MIRROR ID 5 | MIRROR ID 6 | MIRROR ID 7 | VIRTUAL GROUP 1 | VIRTUAL GROUP 2 | VIRTUAL GROUP 3 | VIRTUAL GROUP 4 | RAID GROUP 1 | RAID GROUP 2 | RAID GROUP 3 | RAID GROUP 4 | DRIVE READY |
|---|---|---|---|---|---|---|---|---|---|---|---|---|---|---|---|---|---|
| 0 | | | | | | | | | | | | | | | | | |
| 1 | | | | | | | | | | | | | | | | | |
| 2 | | | | | | | | | | | | | | | | | |
| 3 | | | | | | | | | | | | | | | | | |
| 4 | | | | | | | | | | | | | | | | | |
| 5 | | | | | | | | | | | | | | | | | |
| 6 | | | | | | | | | | | | | | | | | |
| 7 | | | | | | | | | | | | | | | | | |

FIG.27

TABLE USED BY PRESENT INVENTION TO STORE SECONDARY SCSI BUSS DEVICE CONFIGURATIONS

CONTROL FLOW WHEN READING WITH READ AHEAD BUFFER

DATA BUSS INTERFACE AND EXPANSION SYSTEM

TECHNICAL FIELD

The present invention generally relates to devices which are attached to a host computer, and more specifically, deals with devices attached to a data buss of a host computer for providing enhanced buss capability to the host computer.

BACKGROUND OF THE INVENTION

This invention in general relates to the input/output devices which conform to a communications protocol standard known as the Small Computer System Interface standard (hereinafter SCSI). The first version of SCSI (SCSI-1) is described in ANSI X3.131-1986. The SCSI-1specification has recently been upgraded with an expanded interface, SCSI-2. There is not yet an official document for the SCSI-2 spec at the time of this filing.

The SCSI standard was adopted as an input/output standard by Apple Computer, Inc. for its Macintosh product line in 1986. It was also adopted at a later date by IBM Corporation as an input/output standard for its PS/2 product line. Disk drives using the SCSI interface have consequently been connected to or incorporated into personal computers since 1986. During this time the capacities of new drives have increased more than twenty-fold. A typical SCSI drive in 1986 had a 10 megabyte capacity (Rodime, Inc.). In 1990, Quantum Corporation sold a drive of an equivalent form factor (or physical size) with a capacity of 210 megabytes. Owners of drives produced in 1986, and owners of drives produced since then, however, have not been able to take advantage of the increased capacity of the newer drives other than by purchasing the newer drives. In addition newer drives can operate at higher effective rates through the use of "read-ahead buffers" and "track caches". Owners of drives without these capabilities have not been able to take advantage of this ongoing advance in drive technology.

The SCSI standard defined in 1986, now known as SCSI-1, has been superseded by what is known as the SCSI-2 standard. Older drives built to conform with the SCSI-1 standard are not able to take advantage of the performance enhancements made possible by the newer standard (which includes wider data paths, increased buss speed, etc.).

Connector technology has also continued to change. For example drives with built-in cables (cables which cannot be changed) cannot be connected to computers or other SCSI devices which use newer connection technology such as that in the Next Workstation or in the Macintosh Powerbook portable computers.

The SCSI standard, even as defined by SCSI-2, is limited to eight devices, including the host computer, connected at one time to the buss.

In the past several years a new type of drive utilization technology has been defined known as RAID. RAID is an acronym for Redundant Arrays of Inexpensive Drives. There are various levels of RAID technology; RAID-1 to RAID-5; the point of RAID is to allow multiple inexpensive drives to be interconnected in such a way that the reliability of the entire set of drives is improved, and to allow the drives to be accessed in parallel. RAID systems, although they include many so-called "inexpensive" drives, are not themselves, as a system, inexpensive. Nor do RAID systems currently on the market, allow dissimilar preexisting drives to be connected together into a RAID configuration.

Notwithstanding the aforementioned short comings, solutions have been limited. Data compression technology has been supplied in software (Stuffit TM, Aladdin Systems; Disk Doubler TM, by Salient Software) and in hardware in the form of data compression chips (Stac, Hewlett-Packard and others). Data compression technology allows any drive to increase its data storage capacity by encoding data in a compact form. However, software solutions are slow, and the hardware solutions (which for the most part are built into newer tape drives) have been implemented as add-in cards specific to a particular computing environment (e.g. DoubleUp TM by Sigma Designs, which works with certain Macintosh computers), and consequently are not available for use with preexisting disk drives.

Therefore, a primary object of this invention is to provide data compression technology which can expand the capacity of any SCSI device which is used to store and retrieve data, including older drives and drives not integral with the present invention, and without restricting the use of that technology to one particular kind of host computer.

Another object of this invention is to expand the number of devices which can effectively be attached to the SCSI buss beyond eight.

A further object of this invention is to increase the effective performance of attached SCSI devices (increasing the useful life of older SCSI drives) by providing expanded data buffering, and by providing a SCSI-2 compliant interface to SCSI-1 devices.

Other objects of the invention are to provide a physical interface between devices which use incompatible connector technology, to provide low-cost RAID technology which can make use of preexisting dissimilar drives, and to allow the creation of virtual devices made up of individual SCSI devices but which appear as monolithic devices to other SCSI devices on the primary SCSI chain.

The present invention accomplishes these objects by functioning as a SCSI device, as well as a means for translating between SCSI devices. As such it interprets SCSI commands and discriminates between SCSI commands meant for itself as well as SCSI commands meant for devices connected to the invention. There is no provision in the SCSI standard for such discrimination. Therefore, the present invention provides an efficient logical adaptation of the SCSI standard to support such discrimination while minimally interfering with the existing SCSI standard.

SUMMARY OF THE INVENTION

In general, the present invention provides a system for intercepting, transforming and retransmitting the signals which are exchanged between two sets of SCSI devices on two separate SCSI busses. In particular, the Data Buss Interface and Expansion System of the present invention provides a SCSI connection means for achieving physical, electrical and logical connection to a "public" or primary SCSI buss, a SCSI connection means for achieving physical, electrical and logical connection to a "private" or secondary SCSI buss, a through connection means on the primary buss allows signals to be passed through unchanged on the "public" SCSI buss, a processor means executes stored programs, data storage means storage programs for execution by the processor means, data storage means store virtual drive and RAID configuration information, data compression means are made available to compress data received from the "public" or "private" SCSI buss, data decompression means are made available to decompress data received through the "private" SCSI buss, data storage means provide buffering for data received on both the primary and secondary SCSI busses and provide temporary memory for use by the processor means, and finally methods for translating signals and data to and from the primary to the secondary SCSI busses and methods for using the signals and data on the SCSI busses to control the data compression means, the data decompression means and the data storage means.

DESCRIPTION OF THE DRAWINGS

FIG. 11 is a block diagram of the preferred embodiment of the present invention highlighting the data path internal to the present invention used for decompression from a RAID configuration along Path B in FIG. 3.

FIG. 12A is a diagram representing the structure of a SCSI command as defined by the SCSI specification.

FIG. 12B is a diagram representing the control byte portion of a SCSI command as defined by the SCSI specification.

FIG. 13A is a diagram representing the structure of a SCSI command as redefined by the present invention.

FIG. 13B is a diagram representing the control byte portion of the SCSI command as redefined by the present invention.

FIG. 27 is a diagram representing the 128 byte configuration table used to store information about the configuration of the devices attached to the secondary buss (referenced in FIG. 16).

DETAILED DESCRIPTION OF THE PREFERRED EMBODIMENT

Figure 1:
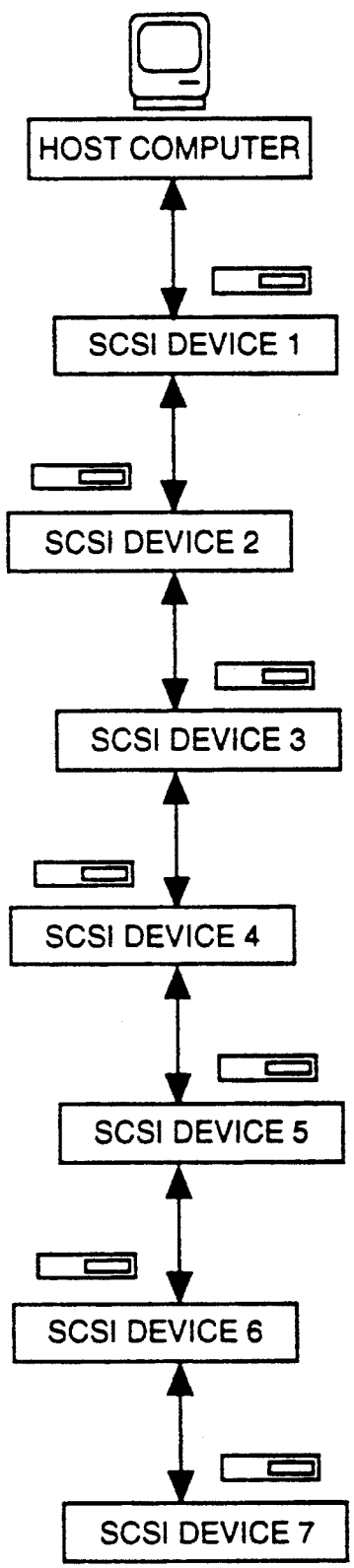
FIG. 1 is a diagram schematically showing the relationship between a host computer and a maximum of seven SCSI devices according to the present art.

FIG. 1 schematically shows a host computer (which supports the SCSI standard) attached to seven SCSI devices. The host computer (which itself is a SCSI device), and the attached seven devices, are the maximum number of devices allowed by the SCSI specification. The present invention is designed to replace one or more of the attached devices.

Figure 2:
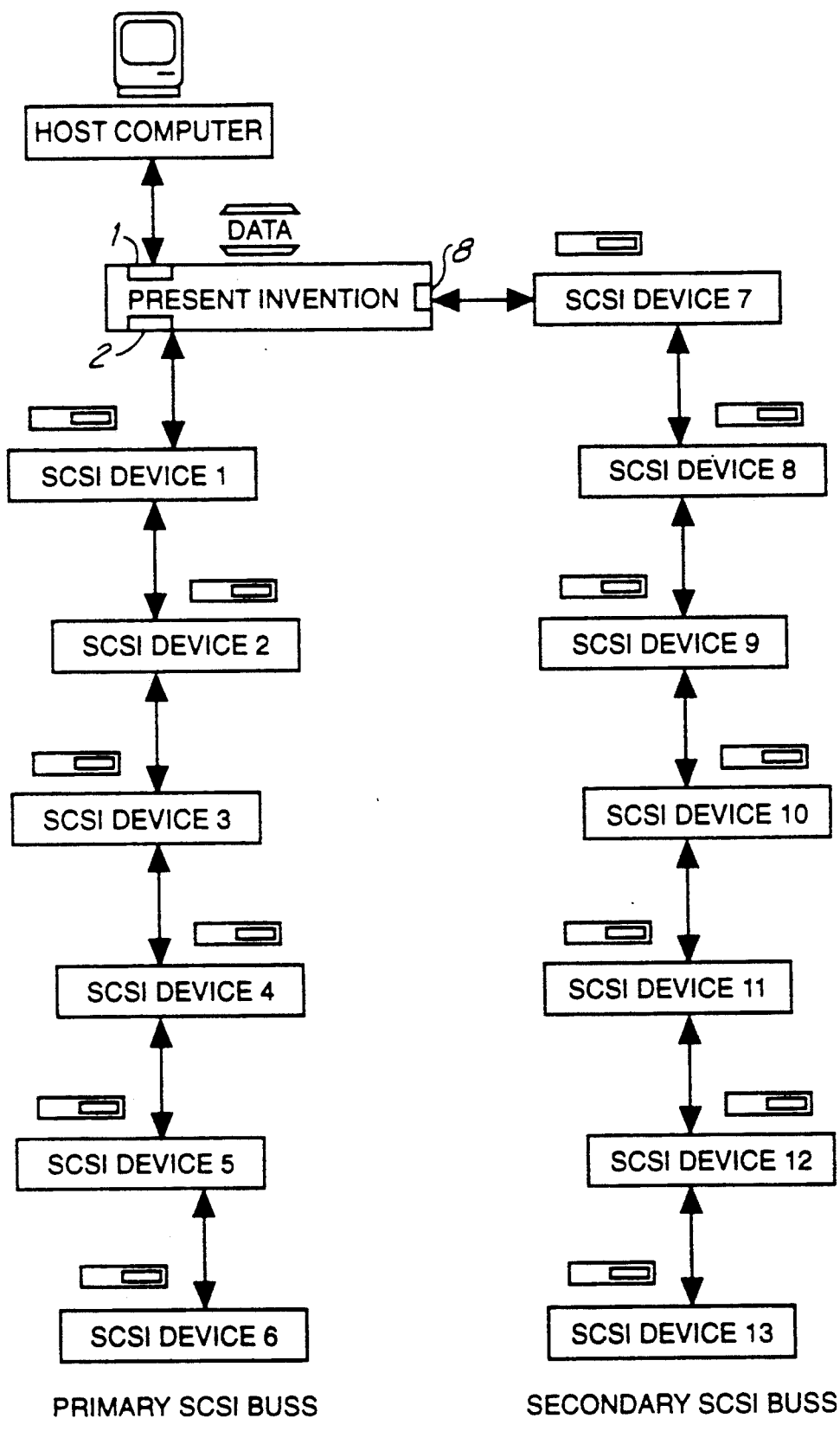
FIG. 2 is a diagram schematically showing how the number of devices attached to the SCSI buss is increased using the present invention.

FIG. 2 is one example of how the SCSI buss capacity can be expanded by the present invention. The preferred embodiment is schematically shown expanding the number of devices attached to a host computer from 7 to 13 (six on the primary buss plus seven on the additional secondary buss). Replacing each of the devices attached directly to the host computer by the present invention would allow 49 devices to communicate with the host computer. The number of extra devices that can be added by each use of the present invention is strictly a reflection of the economies practiced in the preferred embodiment. Alternative embodiments could offer even greater expansion.

Figure 3:
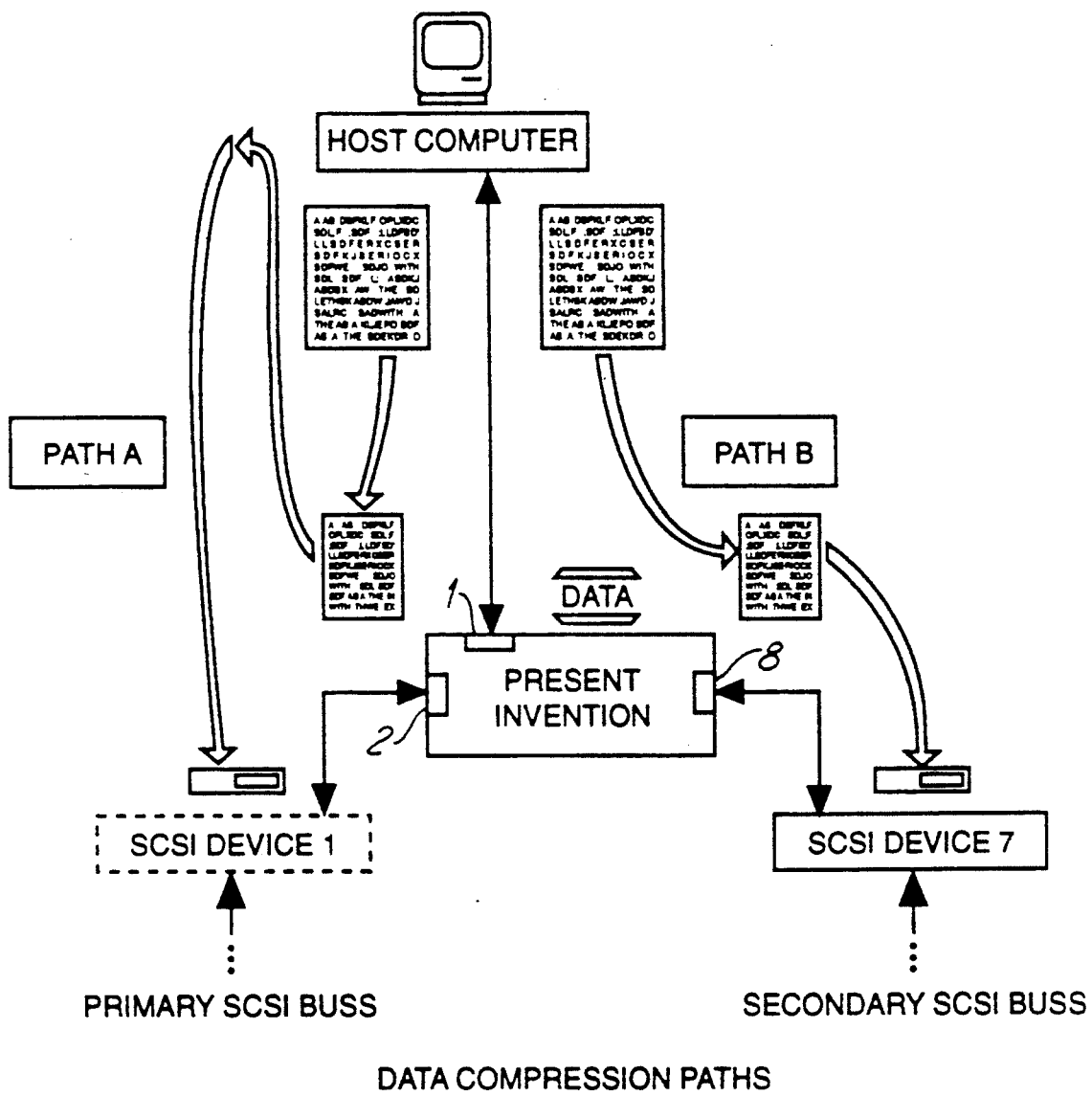
FIG. 3 is a diagram showing two alternate data compression paths over the SCSI buss enabled by the present invention.

FIG. 3 shows in general how the capacities made available by the preferred embodiment can be used by devices on either the primary SCSI chain (marked by Path A) or the secondary SCSI chain (marked by Path B). Many host computers contain internally mounted SCSI devices, with an external SCSI connector. In this case, Path A is used to take advantage of the compression and buffering offered by the preferred embodiment. For host computers where all of the SCSI devices are mounted external to the computer, or for SCSI devices which are added to host computers with an internally mounted drive either Path A or B may be utilized.

Figure 4:
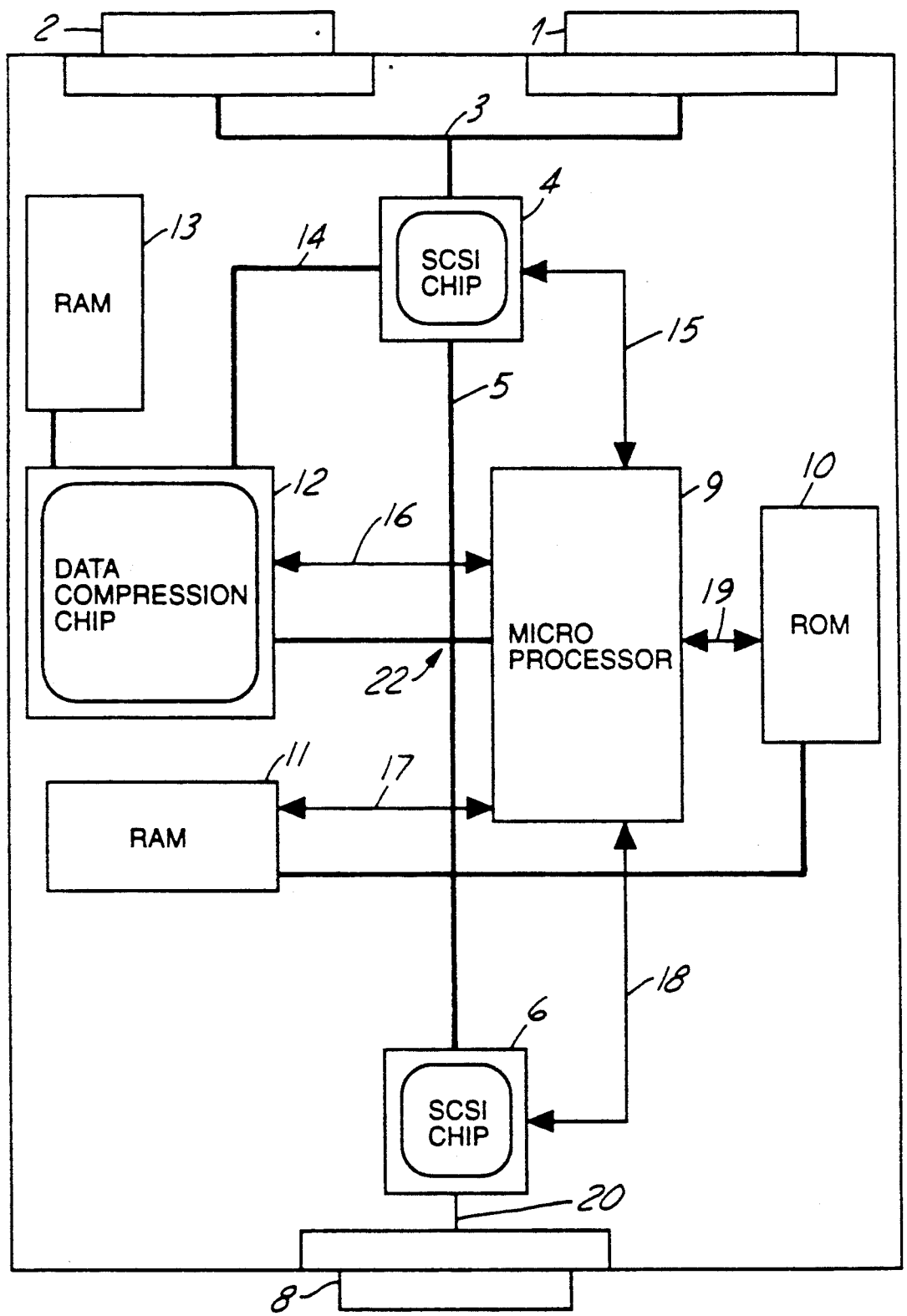
FIG. 4 is a block diagram of the preferred embodiment of the present invention.

FIG. 4 is a block diagram of a preferred hardware embodiment of the present invention. This preferred embodiment is implemented with commercially available LSI logic devices mounted on a single printed circuit board that is housed in an enclosure (not shown) with external connections to an external power supply (not shown). A thumb-wheel switch (not shown) is used to set the SCSI device ID number used by the preferred embodiment. Contemplated alternative embodiments use a similar circuit board mounted with SCSI drives inside of an existing drive housing. Other alternative embodiments include mounting the hardware inside of an existing host computer. Neither of the latter embodiments use an enclosure, external power supply or thumb-wheel switch.

Now referring to FIGS. 2, 3 and 4, connectors 1 and 2 are 50-pin Centronics type external connectors conforming to the SCSI-1 standard. Either connector may be used to connect a host computer or other SCSI device to the primary buss side of the preferred embodiment or to provide through connection means for the primary buss. While 50-pin Centronics connectors are used in the preferred embodiment, planned alternate embodiments will use other connection means and other alternate embodiments could use connector technology compatible with older SCSI devices, such as the 25-pin D-type connector or newer connector technology such as that used in the Next TM workstation or the Macintosh Powerbook TM.

SCSI chip 4 is an LSI logic chip (NCR53C94) used to handle all of the low-level handshaking protocol required by the SCSI standard. This chip supports the SCSI-2 extensions to the SCSI-1 standard and can handle communication with SCSI-2 compliant devices and host computers. This chip uses DMA to store in RAM 11 (or RAM 13) commands and data received on data buss 3 and interrupts microprocessor 9 when commands and data are ready to be processed. Data buss 5 is the central data buss in the preferred embodiment. The portion of data buss 5 extending between SCI chip 4 and node 22 is only logically separate from data buss 14. Physically, the data travels on data buss 14, and is routed through the compression chip 12 but with compression turned off. All other of the LSI devices are attached to buss 5 with the exception of RAM 13. SCSI chip 6 is an NCR53C90B. This chip also supports the SCSI-2 extensions to the SCSI-1 standard but does not include a microprocessor interface. DMA means are provided by microprocessor 9 so that data and commands can be accessed by the SCSI chip 6 independently of the CPU in microprocessor 9.

SCSI chip 6 is connected by data buss 20 to external connector 8 which is a 50-pin type Centronics connector. SCSI chips 4 and 6 together with data buss 5 and connectors 1, 2 and 8 represent one of the core concepts in the present invention, which is to translate between devices which support different versions of the SCSI standard or which support different connector technologies. An alternate embodiment which provides this capability alone (without data compression means or buss expansion means) can be built with two 53C94 chips (SCSI chip 6 is replaced by a 53C94), a RAM buffer and "glue" logic to control handshaking between the two SCSI chips.

Microprocessor 9 is an Intel 80C188. This is a 16-bit microcontroller which includes DMA means. The processor included in the 80C188 executes programs stored in flash EPROM 10 (INTEL 28F001BX-T120) and is used to control access to central data buss 5 (by enabling and disabling chip select logic on devices 4, 6, 10, 11, 12, and 13 using control lines 15 through 19). Microprocessor 9 is also used to program data compression chip 12 and SCSI interface chips 4 and 6 through setting internal register values on those devices.

Flash EPROM 10 is used to store executable programs and configuration information. RAMs 11 and 13 are SRM20100L type static RAM devices. RAM 11 is used to store temporary variables used by microprocessor 9 and to buffer data transferred to and from SCSI interface chips 4 and 6 and to buffer compressed and decompressed data used and generated by data compression chip 12. RAM 13 is used to buffer compressed and decompressed data used and generated by data compression chip 12 as well as to store compression dictionaries generated and used by data compression chip 12. RAM 13 is accessible solely to data compression chip 12. RAM 13 is required to support proper and efficient operation of data compression chip 12.

Data compression chip 12 is preferably an Advanced Hardware Architecture's chip type AH3101 which implements a lossless data compression algorithm and also includes DMA capability for loading and storing data. Data compression chip 12 operates at speeds compatible with SCSI devices so that compression and decompression of data can take place transparently (in terms of speed) in real time. Data buss 14, which connects SCSI interface chip 4 and data compression chip 12, provides a path so that data compression chip 12 can DMA its input and output concurrently.

While the preferred embodiment uses commercially available LSI devices, an alternate embodiment can be made with proprietary custom logic. Such an alternate embodiment could also be built with ROM chips, RAM chips and a high-speed RISC microprocessor such as an Intel 960. Alternate embodiments can also be built which supply additional features. One example of a feature which would provide additional functionality would be to add hardware data encryption circuitry to implement the NIST data encryption standard (DES) algorithm, through the addition of a commercially available DES algorithm LSI logic chip, or through the addition of proprietary logic which implements the DES algorithm. A second desirable feature would be to provide multiple SCSI interface chips (of type 6 in FIG. 4, along with connector type 8) and multiple RAM chips 11 (or a multi-ported RAM chip 11) to thereby increase the processing speed of the disclosed system. Such chips would allow parallel access to SCSI devices attached to the present invention.

FIGS. 5 through 11 illustrate the various paths that data travels as it flows through the preferred embodiment. These paths are further referenced in the flow charts depicted in FIGS. 14 through 29. These data paths are setup by microprocessor 9 by way of control lines 15 through 19. Note that all these data paths are independent of the processor. This is a feature of the preferred embodiment made possible by selecting devices which include DMA capability (devices 4, 9 and 12). Once SCSI interface chips 4 and 6 (or the data compression chip 12) are programmed by microprocessor 9, the data compression and data transfer can take place concurrently with program execution in microprocessor 9. Concurrency is achieved by the use of the cycle-stealing DMA provided by the selected devices and the implementation of multiplexed data buss 5.

Figure 5:
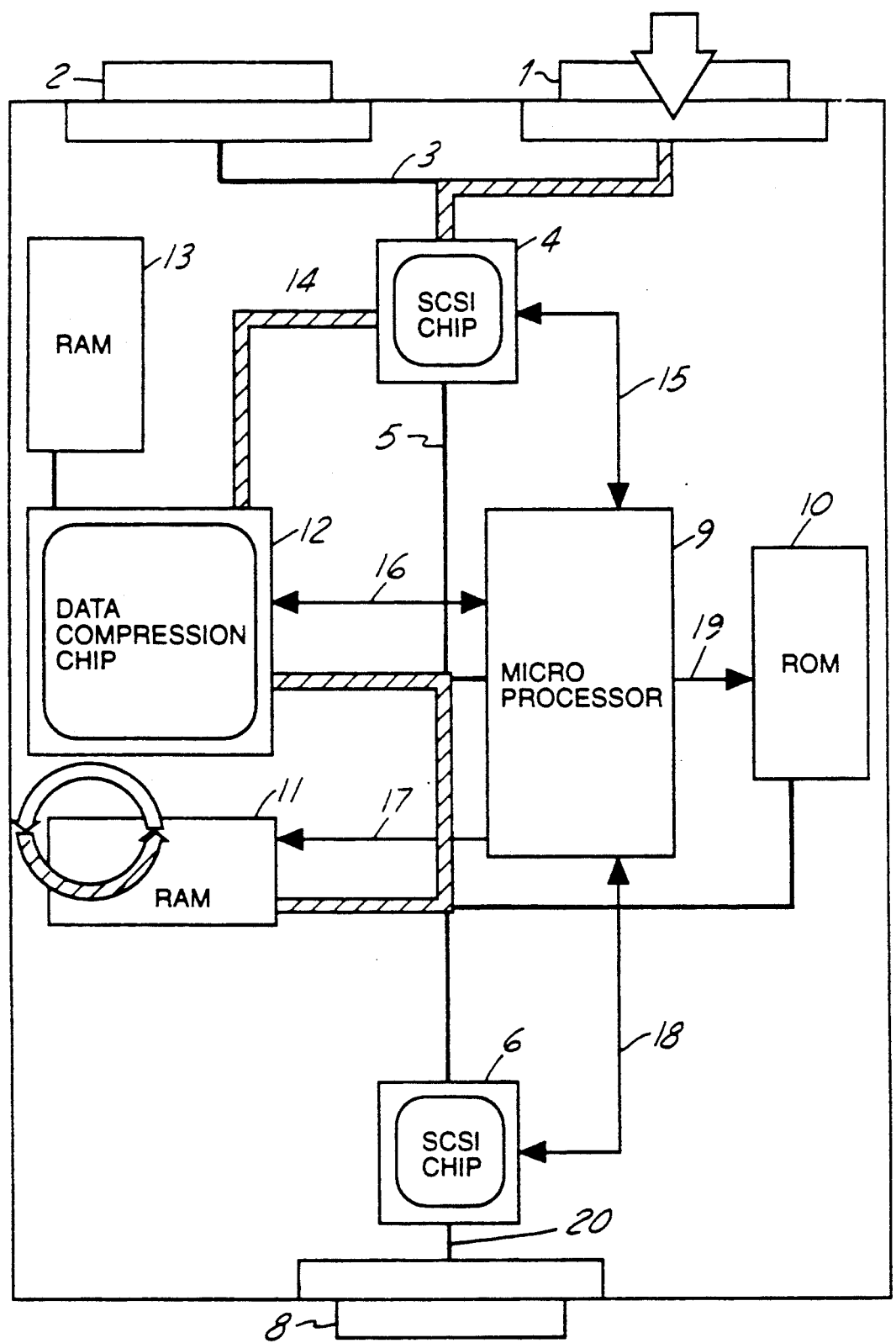
FIG. 5 is a block diagram of the preferred embodiment of the present invention highlighting the data path internal to the present invention used for compression along Path A in FIG. 3.

FIG. 5 illustrates the flow of data when the present invention is used for compressing data received via connector 1 or 2 without subsequently passing the compressed data along to devices connected to connector 8. This is the data path in effect when Path A in FIG. 3 is used for devices connected to connector 1 or 2. The circular arrows overlaying RAM 11 indicate that data compression is performed on uncompressed data stored in RAM 11 and the compressed results are then stored into RAM 11.

Figure 6:
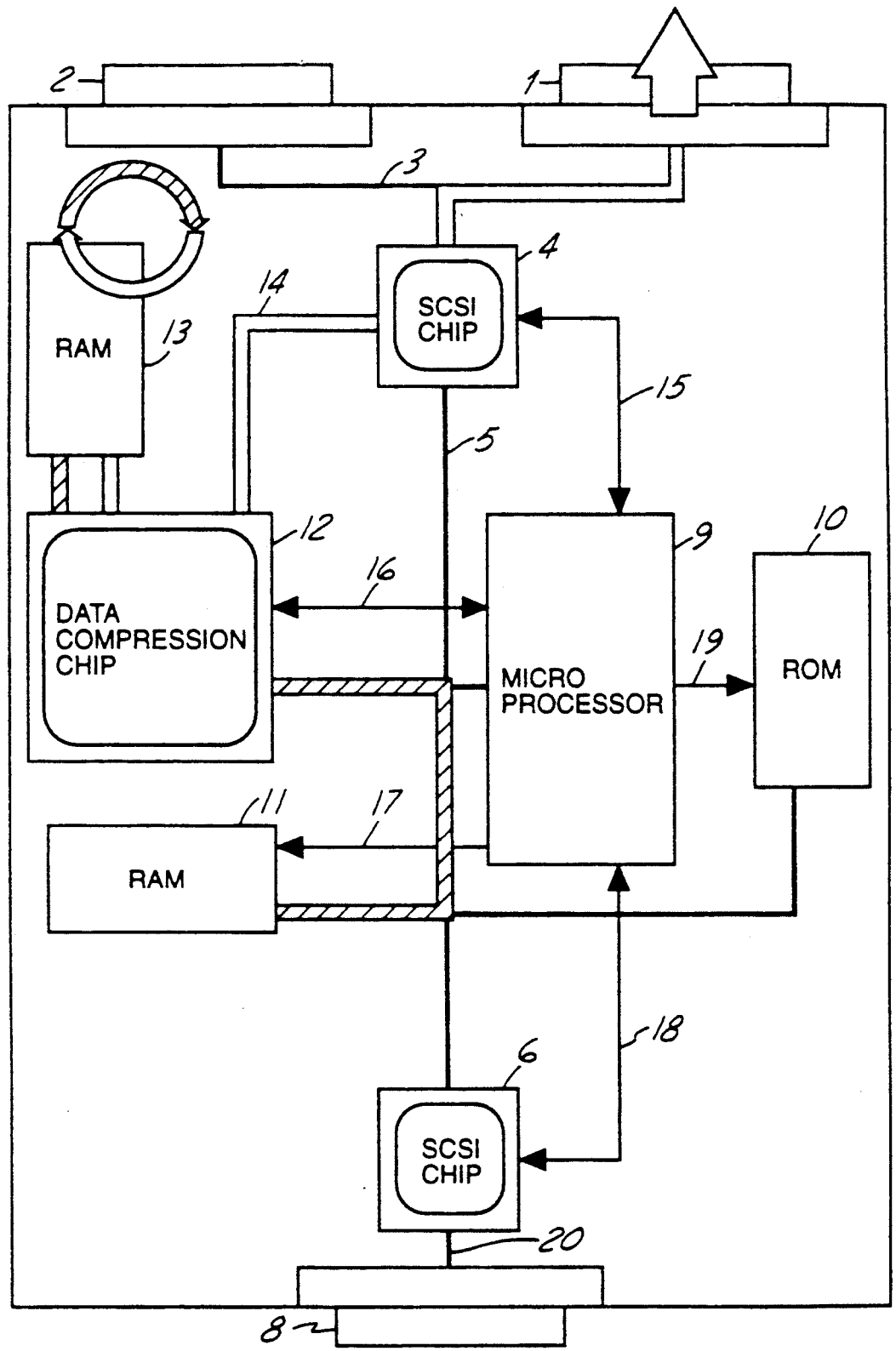
FIG. 6 is a block diagram of the preferred embodiment of the present invention highlighting the data path internal to the present invention used for decompression along Path A in FIG. 3.

FIG. 6 illustrates the flow of data when the present invention is used to decompress data stored in RAM 11 without reading the data from devices connected to connector 8. This is a data path internal to the present invention in effect when Path A in FIG. 3 is used for devices connected to connector 1 or 2. The circular arrows overlaying RAM 13 indicate that data decompressing is done on compressed data stored in RAM 13 and the decompressed results are then stored into RAM 13, before being transferred to a device connected to primary SCSI buss via connectors 1 or 2.

Figure 7:
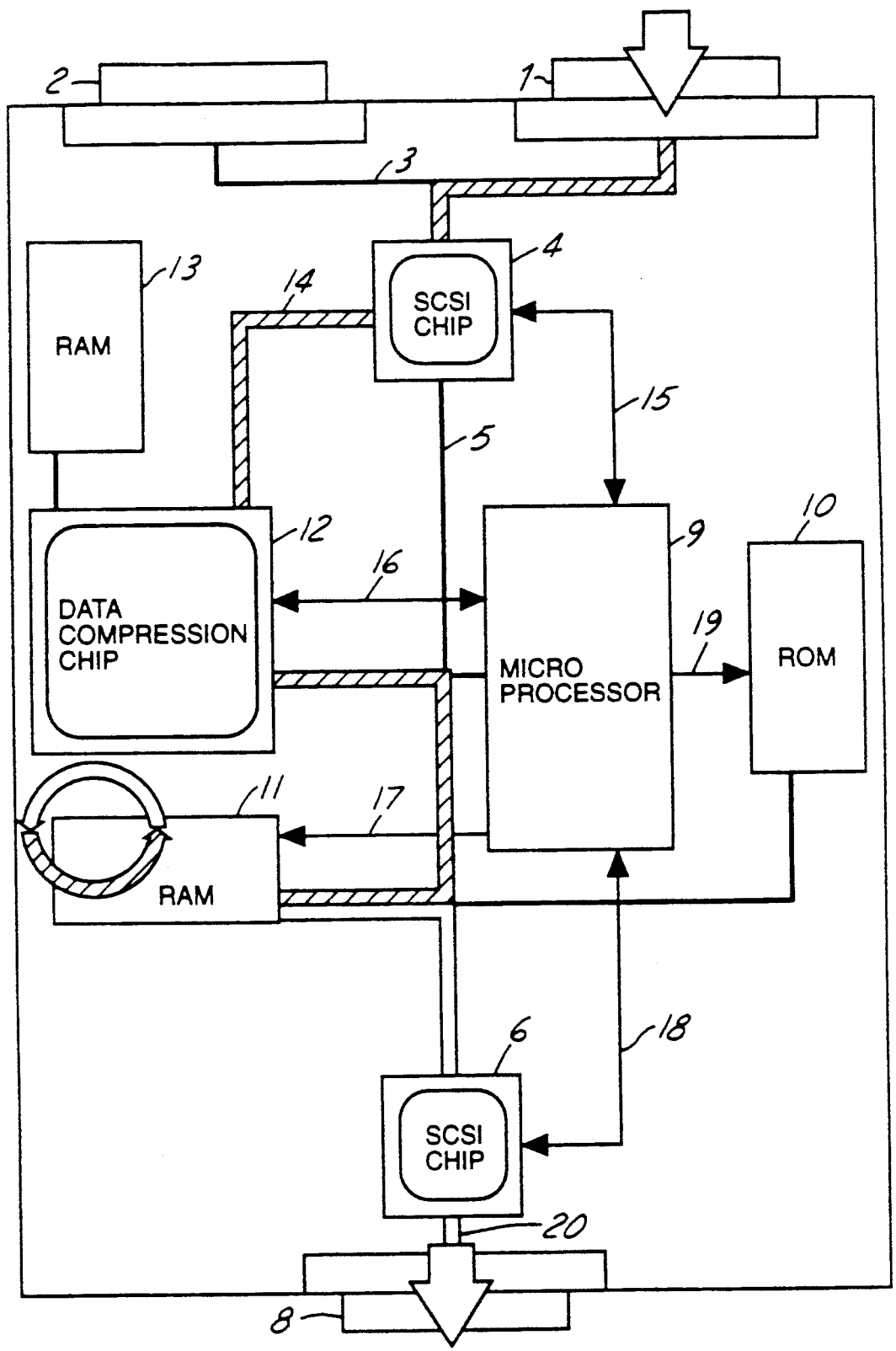
FIG. 7 is a block diagram of the preferred embodiment of the present invention highlighting the data path internal to the present invention used for compression along Path B in FIG. 3.

FIG. 7 illustrates the flow of data when compressing data in the preferred embodiment and subsequently passing the data along to devices connected to the secondary SCSI buss via connector 8. This is the internal data path in effect when Path B in FIG. 3 is used for devices connected to connector 8. The circular arrows overlaying RAM 11 indicate that data compression is done on uncompressed data stored in RAM 11 and the compressed results are then stored into RAM 11.

Figure 8:
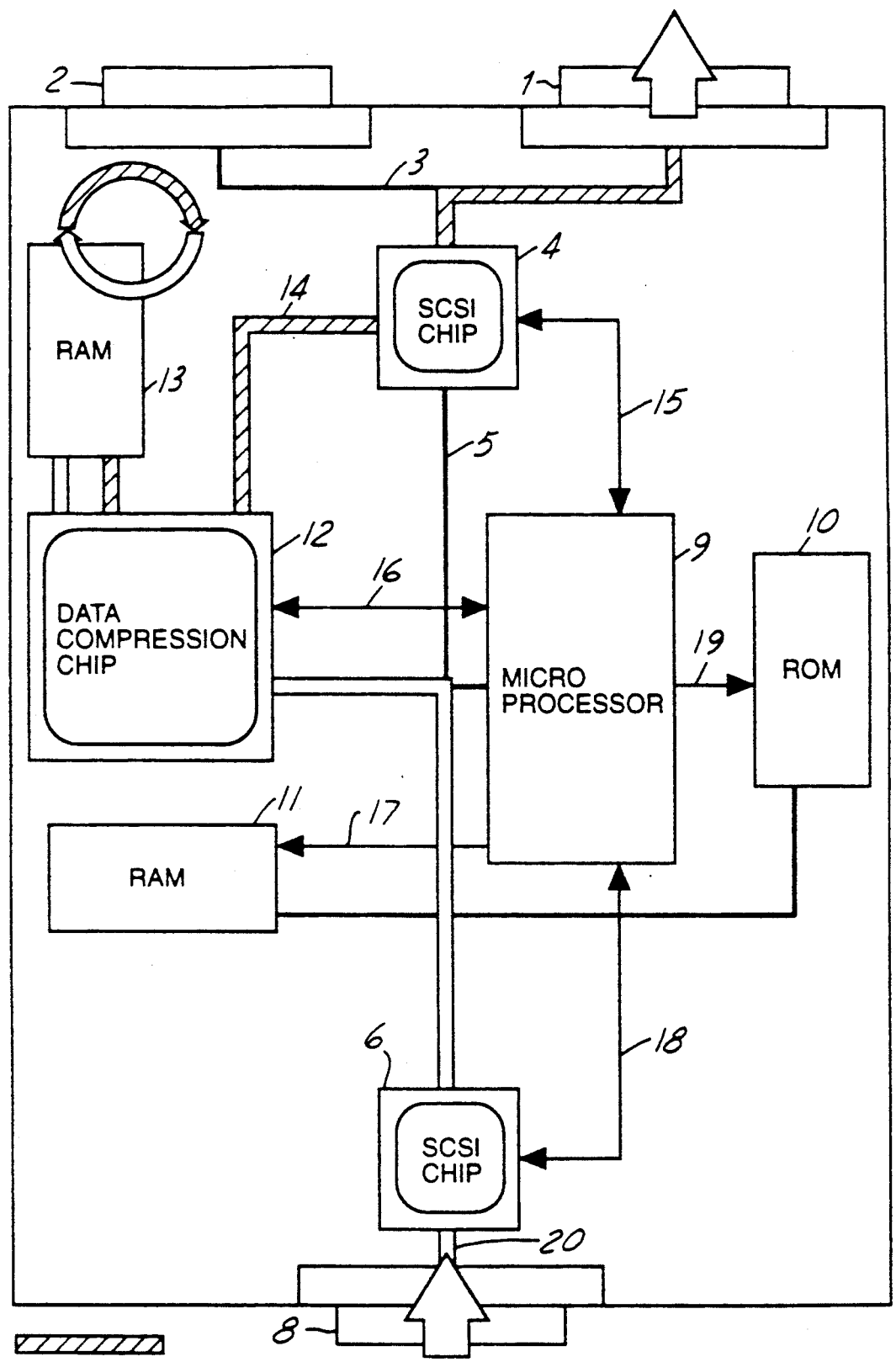
FIG. 8 is a block diagram of the preferred embodiment of the present invention highlighting the data path internal to the present invention used for decompression along Path B in FIG. 3.

FIG. 8 illustrates the path travelled by data when the present invention reads data from a device connected to secondary SCSI buss via connector 8 and decompresses the data before sending it to a device connected to primary SCSI buss. This is the internal data path in effect when Path B in FIG. 3 is used for devices connected to connector 8. The circular arrows overlaying RAM 13 indicate the data decompression is done on compressed data stored in RAM 13 and the decompressed results are then stored into RAM 13, before being transferred out of the preferred embodiment to a device connected to connector 1 through SCSI interface chip 4.

Figure 9:
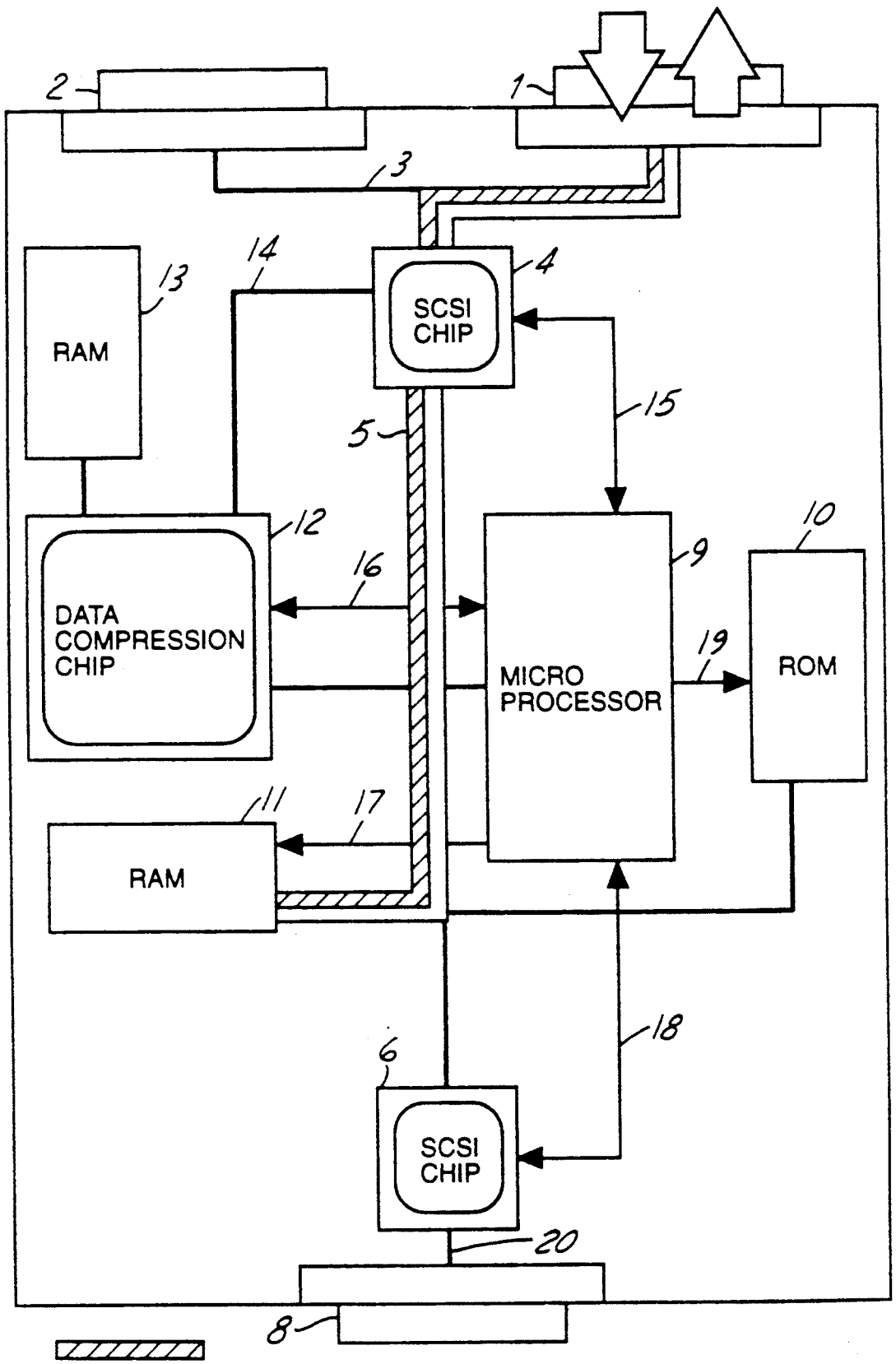
FIG. 9 is a block diagram of the preferred embodiment of the present invention highlighting the data path internal to the present invention used for data buffering along Path A in FIG. 3.

FIG. 9 illustrates the data path when using the preferred embodiment as a buffer without subsequently passing the data along to devices connected to connector 8. This is a data path internal to the present invention in effect when Path A in FIG. 3 is used for devices connected to connector means 1 or 2.

Figure 10:
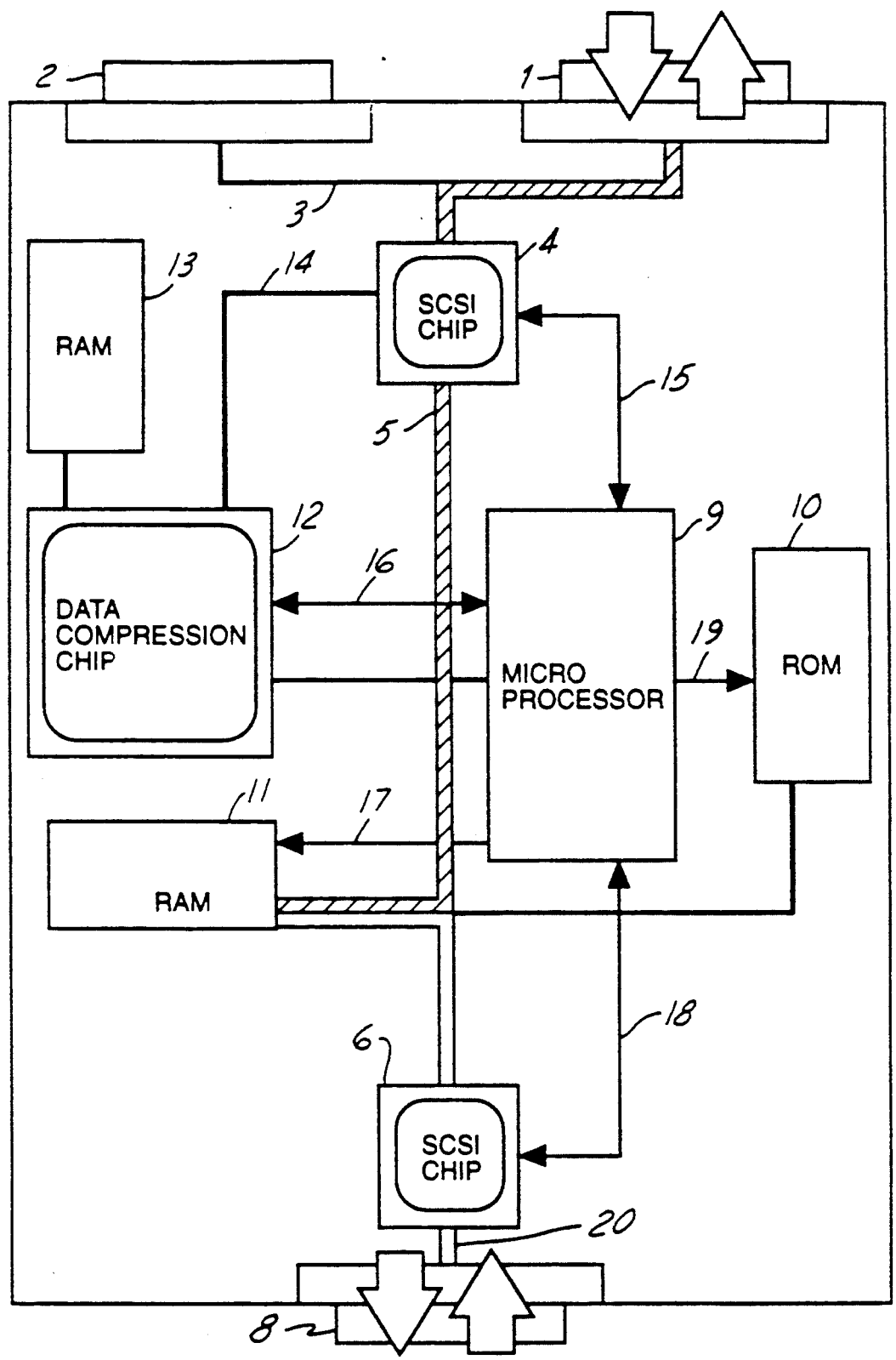
FIG. 10 is a block diagram of the preferred embodiment of the present invention highlighting the data path internal to the present invention used for data buffering along Path B in FIG. 3.

FIG. 10 illustrates the data path when using the preferred embodiment as a buffer and subsequently passing the data along to devices connected to connector 8. This is a data path internal to the present invention in effect when Path B in FIG. 3 is used for devices connected to connector means 8 through SCSI interface means 6.

FIG. 11 illustrates the data path when decompressing data read from devices connected to connector 8 which are configured as a RAID group. This is a data path internal to the present invention in effect when Path B in FIG. 3 is used for devices connected to connector 8. The circular arrows overlying RAM 13 indicate that data decompression is done on compressed data stored in RAM 13 and the decompressed results are then stored into RAM 13, before being transferred to RAM 11. The data in RAM 11 is reorganized before it is sent out to devices connected to the primary buss means.

The remaining portion of this disclosure will use terms defined in the SCSI-1 specification. A SCSI command is sent by an "INITIATOR" (usually the host computer) to a "TARGET" device (the peripheral). A SCSI command sequence consists of phases. The first phase is the arbitration phase, in which the initiator gains control of the buss. The second phase is the target selection phase, in which the initiator places a target ID on the buss and the target having the matching ID responds by changing the signal levels on predetermined SCSI lines (consult ANSI specification X3.131-1986 for further details). The third phase is the command phase in which a six or ten byte command descriptor block (CDB) is sent from the initiator to the target divice (See FIG. 12A for 6 byte CDB format). The command descriptor block specifies the action that is to be taken by the target device. It also specifies if there is to be a data phase, which follows the command phase. During the data phase, data is transferred from the initiator to the target or from the target to the initiator. The direction and length of the transfer is specified by the CDB. Following the command phase and the optional data phase, is the status/message phase. Two bytes (the status and message bytes) are sent from the target to the initiator. These bytes indicate to the initiator whether the command completed successfully. If the command did not complete successfully, the status byte will report a "CHECK CONDITION" status. This indicates to the initiator that there was a problem with the last command. The initiator can acquire more detailed information on the exception condition by issuing a REQUEST SENSE command, following the current command.

FIG. 12A is a diagram representing a typical six byte length CDB command. CDB commands are either six or ten bytes in length. For purposes of illustration a six byte command will be used. The first byte of the command (byte 0) is the operation code. The operation code defines the class of the operation which the SCSI device is to implement and the code values are defined in the ANSI specification referred to earlier. Example operation codes are 0 =TEST UNIT READY, 3 =REQUEST SENSE, 4=FORMAT, 8=READ, 10=WRITE, 18 =INQUIRY, 21=MODE SENSE and 25=MODE SELECT. Byte 1 has three bits (5 through 7) reserved to select a Logical Unit Number (LUN). The SCSI specification allows SCSI devices to control more than one drive (LUN); for example a tape drive could have multiple cassettes, and an individual cassette could be addressed by varying the LUN number (cassette 1=LUN 0, cassette 2=LUN 1 and so on). The logical block address (LBA) is in bytes 1, 2 and 3. Only 5 bits of byte 1 are used, giving 21 bits of logical block address. The LBA is typically only used in read and write commands. The transfer length specifies the number of blocks to be read or written (1-255 blocks, with 0 signifying 256 blocks). The control byte (byte 5), detailed in FIG. 12B, specifies only bits 1 and 0 which are used when a device can accept what are called linked commands (which are not relevant to the preferred embodiment). Bits 2-7 of byte 5 are not defined by the SCSI specification and are ignored by most SCSI devices.

FIGS. 13A and 13B represent the logical modifications made to the SCSI specification by the preferred embodiment in order to implement buss expansion and data compression. As a matter of actual practice, few (if any) SCSI devices actually support or use the LUN bits, since few (if any) devices contain more than one logical drive, moreover the SCSI specification allows another method of identifying logical units (LUNs) to the initiator other than using bits 5-7 of byte 1. In fact the SCSI programming manuals released by drive manufacturers typically specify that these bits must be set to 0 (c.f. Quantum Corporation manuals). Therefore the preferred embodiment uses the LUN bits to identify the devices attached to the secondary SCSI buss via connector 8. This limits the SCSI devices which the preferred embodiment supports on the secondary buss to those devices which do not use LUNs themselves. As a matter of practice this is not a limitation at all. The preferred embodiment has its own SCSI ID (set by a thumb wheel switch which is not shown). The preferred embodiment's SCSI ID is used as the valid ID on both the primary and secondary busses. SCSI devices typically have an external means to set the ID used by the device, which must be a number between 0 and 7. Thus for example, referring to FIG. 2, assume the following arbitrary assignments of SCSI IDs:

| PRIMARY BUSS | SECONDARY BUSS | LUN # |
| --- | --- | --- |
| SCSI Device 1 = ID 0 | SCSI Device 7 = ID 0 | 0 |
| Present Invention = ID 1 | Present Invention = ID 1 | 1 |
| SCSI Device 2 = ID 2 | SCSI Device 8 = ID 2 | 2 |
| SCSI Device 3 = ID 3 | SCSI Device 9 = ID 3 | 3 |
| SCSI Device 4 = ID 4 | SCSI Device 10 = ID 4 | 4 |
| SCSI Device 5 = ID 5 | SCSI Device 11 = ID 5 | 5 |
| SCSI Device 6 = ID 6 | SCSI Device 12 = ID 6 | 6 |
| Host Computer = ID 7 | SCSI Device 13 = ID 7 | 7 |

Using the modification to the specification implemented by the preferred embodiment, the devices on the secondary buss are addressed by selecting device ID 1 during the target selection phase and then specifying a LUN. The preferred embodiment is LUN 1 in this method. The preferred embodiment interprets this modified command and itself starts a command sequence going in which it uses the specified LUN as the target ID on the secondary buss. The details of this process are more fully set out below.

Now referring to FIGS. 13A and 13B, two bits (bits 2 and 3) on the control byte (byte number 5), which are not specified by the SCSI specification, are used to signal the preferred embodiment to turn data compression on and off. An alternate embodiment is to use three of the remaining bits of the control byte to specify the LUN. This method was not implemented on the preferred embodiment because these bits, while not defined, tend to be used by specific manufacturers of SCSI devices for their own purposes. An alternate embodiment could also use some of these bits to specify the turning off and on of data encryption means. This by no means limits the methods which alternate embodiments could use logically to extend the SCSI specification for use by the present invention. A more cumbersome method, though one guaranteed not to interfere in any way with current devices, would be to define totally new CDBs (there are unused operation codes available for this purpose). For example, a command could be defined which when sent to the present invention would specify that subsequent commands were to be sent to a particular device on the secondary buss until the receipt of a complementary command which would tell the present invention that commands would now be meant for it directly.

Figure 14:
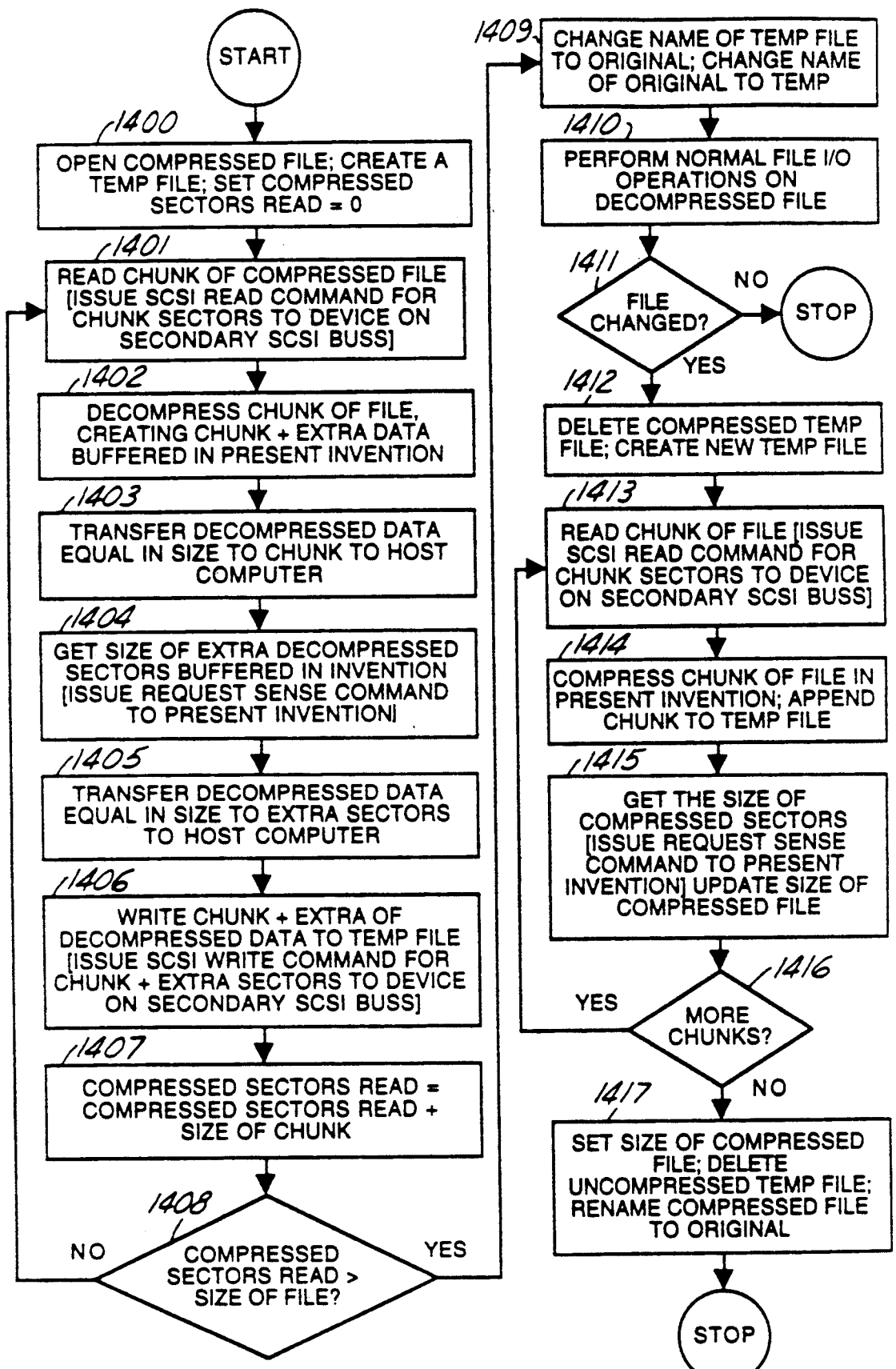
FIG. 14 is a flowchart representing an example of a use of the present invention by a host computer.

FIG. 14 is a flow chart which gives an example of the use of the present invention to compress or decompress a file which is stored on a device attached to the present invention's secondary SCSI buss. The method disclosed in this figure is one which requires a minimal modification of an existing file system on the host computer. File systems typically access files in a random method, meaning that pieces of a file are not accessed in a predefined order when a file is opened for use. Further, the pieces of the file are known to be at fixed positions relative to the start of the file. This creates a problem for files which are compressed because file systems and programs deal with uncompressed data whereby the act of compressing data changes the positions of data relative to the start of a file. This method solves this problem by intercepting open, write, and close calls (or commands) to a file. Files are stored in a compressed format on the SCSI device, but appear to be uncompressed files to the host operating system. At the time an application program running on the host computer issues a command to open a file, the intercepting code, running on the host computer, creates a temporary disk file (step 1400), uses the present invention to decompress the contents of the opened file and stores the decompressed data into the temporary disk file (loop on steps 1401 through 1408). The intercepting code then changes the name and other identifying data of the temporary disk file to that of the opened file (and vice versa), and in effect indicates to the host file system that the temporary disk file is the one it has requested (step 1409). At this point host software accesses the file as it would any decompressed file, changing data and extending the file as needed (step 1410). Commands to write to the file are intercepted, with the sole object of determining if contents of the file have been altered. If the file is written to then there is a presumption that the file contents have been altered. (Interception of the write calls is not shown in FIG. 14). When the file is closed, the intercepting code checks to see if the file has changed (step 1411). If it has, then the old compressed version of the file is deleted (step 1412), and the intercepting code uses the present invention to compress the updated version of the disk file (loop on steps 1413 through 1416). Again a temporary file is opened and the compressed data is stored in it. When compression is completed, the compressed temporary file is given the name and identification of the original uncompressed file and the uncompressed file is deleted (step 1417).

Note that there is a further problem associated with compressed files that is solved by steps 1404 and 1405 and the use of the present invention. The SCSI standard does not allow for a variable amount of data to be associated with a read or write command. But when the intercepting code on the host computer asks for a fixed amount of compressed data to be read and decompressed, the decompressed data will be greater than or equal in size to the compressed data and the excess cannot be predicted until the actual time of the decompression. The present invention keeps statistics on the actual sizes of compressed and decompressed data (see below). This data is returned by the present invention in response to a REQUEST SENSE command (step 1404) and used by the intercepting software to calculate the amount of extra data which must be transferred in a subsequent read command (step 1405). An alternative method would be to define Compress and Decompress commands analogous to the Read and Write commands which would handle variable length data. The equivalent problem when compressing a file (where the compressed data written to the device on the secondary buss is less than the data transferred to the present invention in the SCSI Write command) is solved by issuing a REQUEST SENSE after every write command to the present invention. The intercepting software uses this information to calculate the amount of space actually used (step 1415). It then makes sure that the next write begins at the end of the compressed data as written to the device rather than at the position that would be calculated from the length of data specified in the previous SCSI write command itself.

When opening a compressed file, the method disclosed in FIG. 14 generates the following repeated sequences of SCSI commands: Read with Decompress—Request Sense—Write. When compressing a file, the method disclosed in FIG. 14 generates the following repeated sequences of SCSI commands: Read—Write with Compress—Request Sense. In fact all communication to and from the present invention is in the form of SCSI commands along with data. At the algorithmic level, the present invention is a SCSI command interpreter, or "SCSI Machine".

Figure 15:
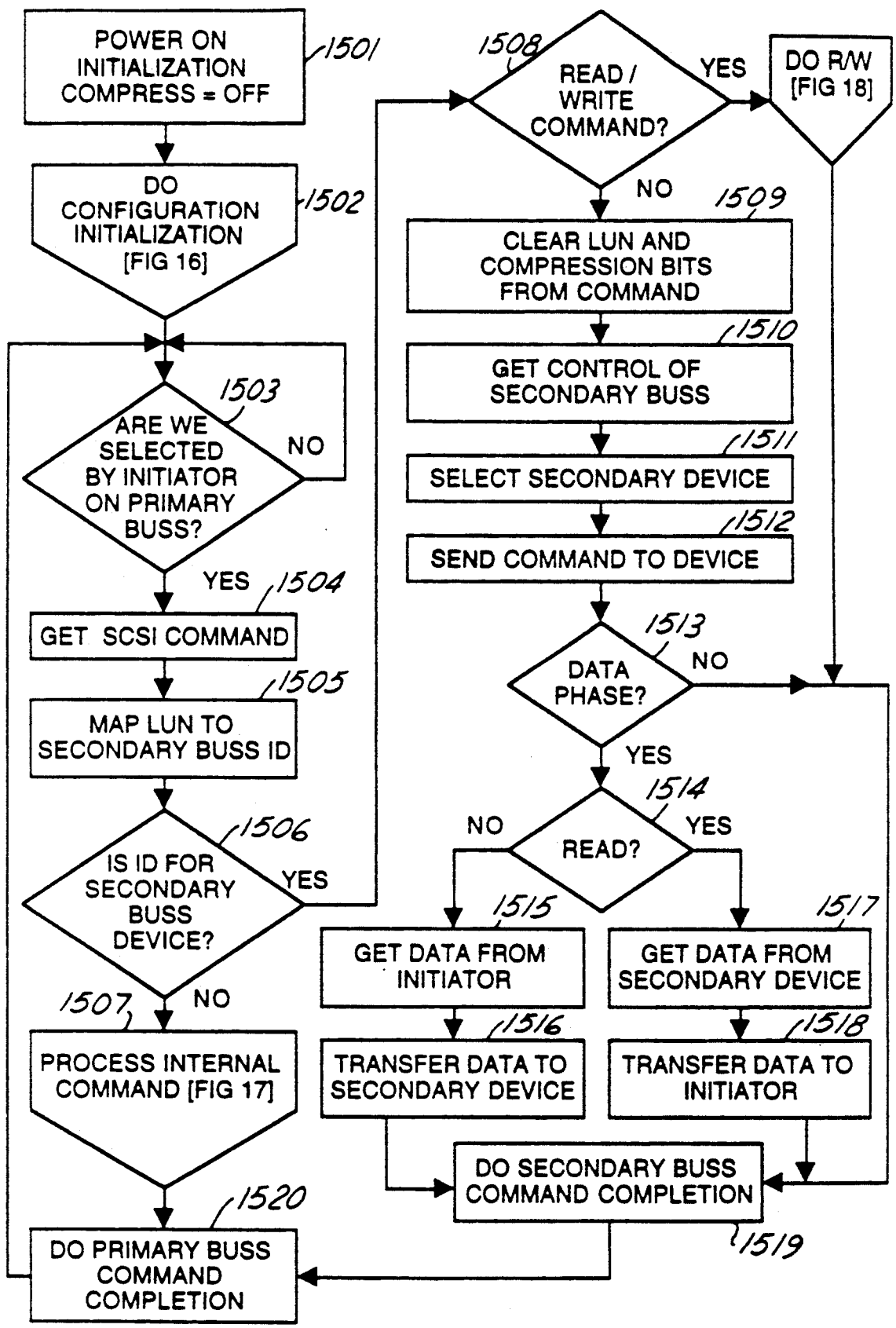
FIG. 15 is a flowchart of the main loop of the preferred embodiment of the present invention.

FIG. 15 is a flow chart of the main control loop, which discloses the operation of the present invention at its highest level. Step 1501 sets an internal state variable (called COMPRESS) OFF (see discussion below on FIG. 18 for details of use of the COMPRESS variable) as does the power up condition (such as initiat;lizing data compression chip 12 and the SCSI chips 4 and 6). Step 1502 involves testing to determine what devices are attached to the secondary SCSI buss. Step 1502 is disclosed in further detail in the discussion of FIG. 16. Step 1503 represents the present invention's idle loop. The machine remains in this loop until it is interrupted by SCSI chip 4, such interrupt indicating that the SCSI chip has received a command for interpretation (step 1504). Once the command is received the present invention must interpret the LUN bits in the command (step 1505). Part of the configuration information stored by the present invention is in a LUN map. This is simply an eight byte table which maps LUN bits into IDs. The default mapping is LUN 0=ID 0, LUN 1=ID 1, ... Lun 7=ID 7. This mapping can be changed by a MODE SELECT command (see discussion below of FIG. 17). The preferred embodiment of the present invention maintains the same ID on both the primary and alternate SCSI busses, that is, if the present invention has an ID 2 on the primary buss, then its ID is 2 on the secondary buss, and commands meant directly for the present invention, would have LUN bits equal to 2 (using the default mapping). Step 1506 test the LUN bits for a value which matches the value in the LUN mapping table corresponding to the SCSI ID of the present invention. If the IDs do not match, Step 1507 is executed. The command processing in step 1507 is covered in detail in the discussion below of FIG. 17. If the LUN bits map to an ID which belongs to a secondary buss device, test 1508 is executed. Test 1508 separates read and write commands from the other SCSI commands. Read and write commands are subject to interpretation before they are passed along to the secondary chain devices and the details of read/write processing are covered below in the discussion on FIG. 18. If the SCSI command is not a read or write command, the present invention first clears the LUN bits from the received command (step 1509) and then begins a command sequence on the secondary buss (step 1510). The sequence is to get control of the buss (1510), select the secondary device (1511), send the command (1512), and then test to see if a data phase is required (1513). The existence of a data phase is dependent on the type of command. If no data phase is required, status/message phase is executed (1519) and the status and message bytes are retransmitted to the initiator, completing the status/message phase on the primary buss SCSI command which was received at step 1504. If the result of test 1513 is that there is a data phase, then test 1514 checks for a read. ("Read" and "Write" in this context do not refer to commands but to the direction of data transfer). If it is a read, data is transferred from the secondary buss device to the initiator (steps 1515-1516). If it is a write, data is transferred from the initiator to the secondary buss (steps 1517-1518). After the data is transferred the status/message phase on the secondary buss is executed (1519), status/message phase on the primary buss is executed (1520) and the present invention returns to its idle loop (1513) waiting for the next SCSI command.

The present invention also allows drives that are attached to the secondary buss to be grouped in one of three ways: as a mirror pair, a virtual device, or a RAID group. A mirror pair is a set of two identical drives. One of the pair is the primary drive, and the other is the "mirror". Everything that is written to the primary drive is also written to the mirror drive. If the primary drive fails then the mirror drive can replace the primary drive while it undergoes repair or replacement. With a mirror drive no data is lost unless the primary drive fails during write command execution, and then only the data that would be written during that command is lost. A virtual device is used to group a set of drives into what looks like a single large drive to the host computer. For example, three 400 megabyte drives can be made to look like one 1.2 gigabyte drives. Virtual devices are organized sequentially. In the above example, sectors 0-799,999 are on disk one, 800,000-1,599,999 are on disk two and sectors 1,600,000-2,399,999 are on disk three. Virtual devices can be made from heterogeneous drives. A RAID group is also used to make a set of drives look like one large drive. One of the drives in the group is used as a parity drive, so that data will not be lost if any one (but only one) of the set of drives fails. The size of a RAID group is equal to the number of drives in the group (minus one) times the size of one drive. Software running on the host machine, by sending a MODE SELECT command to the present invention can group secondary buss drives into one of the three kinds of groups (see discussion of FIG. 17 below for more on MODE SELECT).

Figure 16:
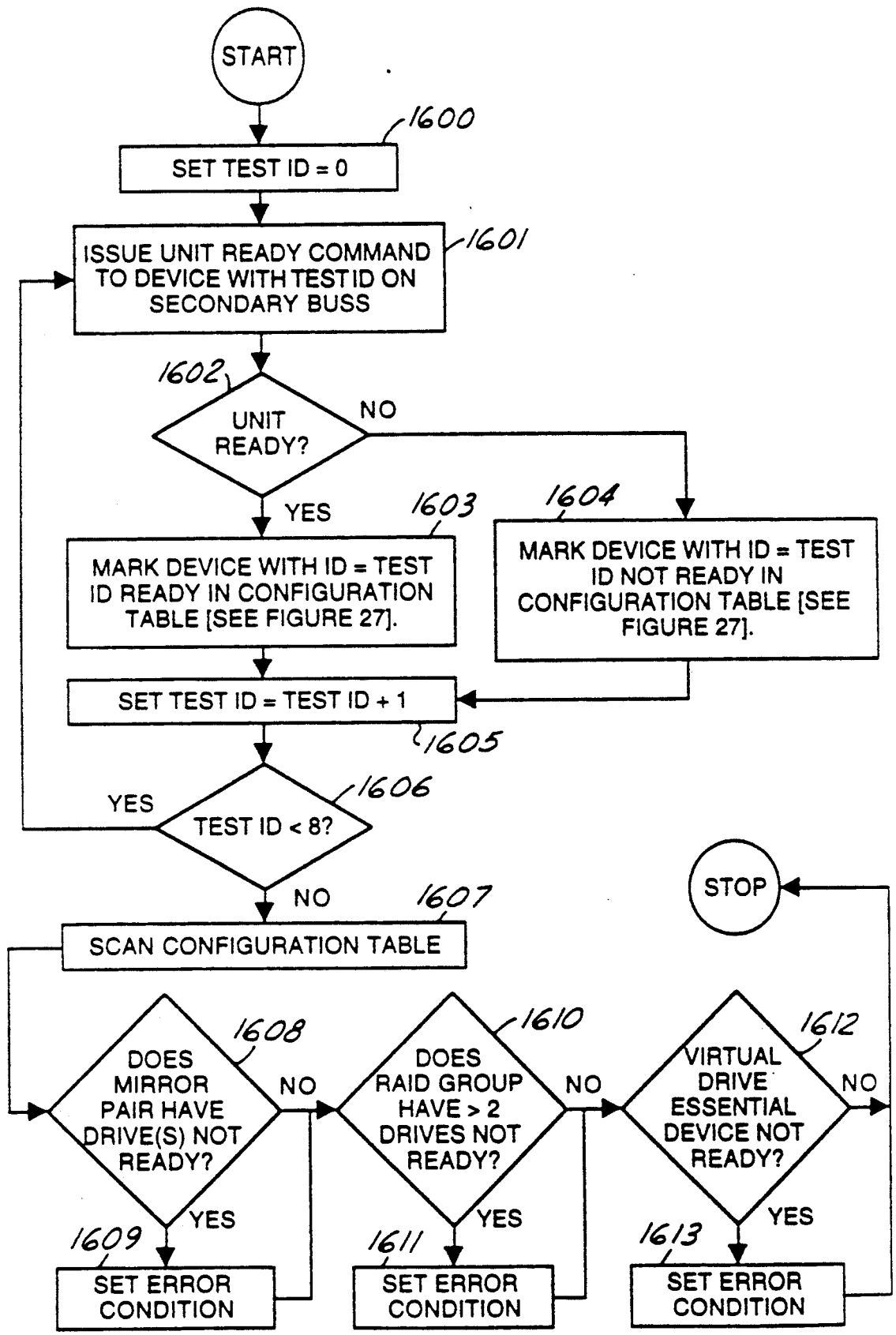
FIG. 16 is a flowchart of the configuration initialization procedure of the present invention (referenced in FIG. 15).

It is the function of the configuration initialization code to make sure that the groups which have been defined in the configuration table (FIG. 27) are actually available to use. FIG. 16 is the flow chart of the configuration initialization code. Steps 1600-1606 comprise a loop for issuing a TEST UNIT READY command to each of the possible devices attached to the secondary buss. If the device is ready it is so marked as such in the configuration table (step 1603), otherwise it is marked as unavailable (step 1604). Once all drives have been tested for readiness, the configuration table is scanned by columns. The columns marked with "Mirror ID n" are a matrix. If a particular drive is matched with a mirror drive, and either drive is not ready, then an error condition exists and the condition is saved by the present invention (steps 1608–1609) (the error will be reported in response to a REQUEST SENSE command). The columns marked "Virtual Group n", define up to four possible virtual devices. If a drive is a member of a group, there will be a one at that drive's row in the first group column. The columns marked "RAID Group n", define up to four possible RAID groups. If a drive is a member of a group, there will be a one at that drive's row in the first group column. In a virtual group some drives can be missing while still allowing access to the rest of the drives, which drives are essential are specific to the file system in effect on the host computer. If an essential drive in a virtual group is missing, then an error condition exists and is so noted by the present invention (step 1610–1611). A RAID group can function perfectly with one of its drives non-functional. However if more than one of the group is not available, then this is an error condition and is so noted by the present invention (steps 1612–1613).

Figure 17:
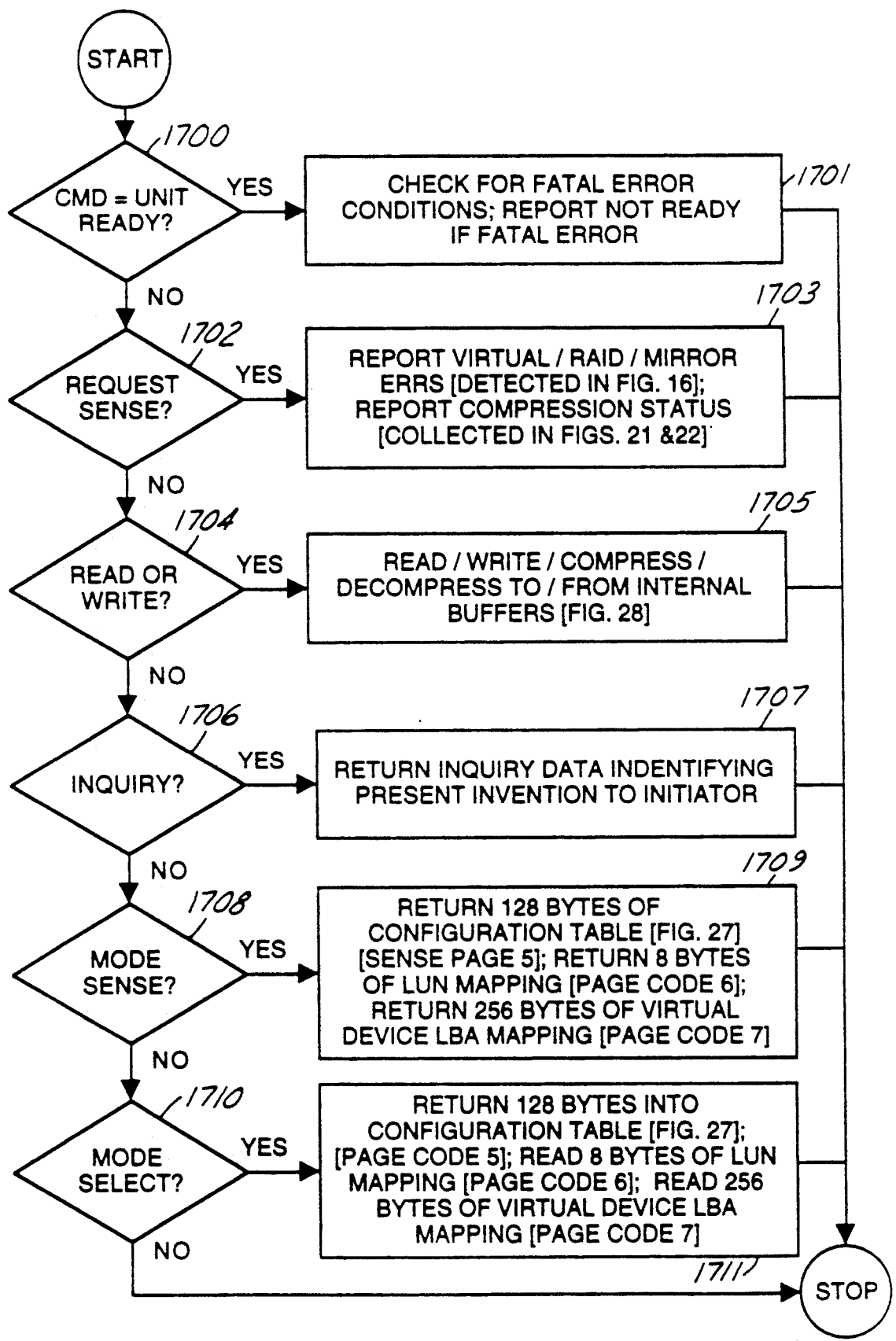
FIG. 17 is a flowchart of the SCSI commands interpreted directly by the present invention (referenced in FIG. 15).

FIG. 17 represents in a flow chart the SCSI commands which the present invention handles directly. UNIT READY is a standard command used by devices to report that they are ready for I/O. For example, devices with removable media typically report not ready when there is no media in the drive. In the case of the present invention, which can function with or without drives attached to the secondary SCSI buss, the present invention is ready as long as internal memory tests OK and the data compression chip is known to be working. Otherwise the present invention reports not ready in response to the UNIT READY (op code 0) command. The REQUEST SENSE (op code 3) command is used to report configuration errors and compression statistics. The READ and WRITE (op codes 8 and 10 respectively) commands are used to buffer data for slower drives and to compress data without routing it on through to an attached secondary device. The READ and WRITE commands are shown in further detail in FIG. 28. The INQUIRY command (op code 18) is used to return to the host software strings which identify the manufacturer and model number of a SCSI device. The MODE SELECT (op code 26) command allows the host software to configure the devices attached to the present invention by reading in a configuration table (FIG. 27) from the host software and writing it into the present inventions flash EPROM. MODE SELECT also allows the host software to download the LUN mapping table and save it in the same manner, as well as allowing the host software to configure a virtual device by way of a virtual device table. The virtual device table is an 8×4×12 byte table, with a twelve byte entry corresponding to each of the boxes in the four "Virtual Group n" columns. Each twelve byte entry is made up of one four byte sector address and two four byte logical block addresses. The sector address represents the first sector on the disk which is used for virtual device blocks. The first LBA represents the block number on the virtual device which is mapped to that physical sector on the disk. The second LBA represents the last LBA in the virtual device which is mapped to the disk. The page codes listed in the text of FIG. 17 represent the mode select page numbers used by the preferred embodiment. The MODE SENSE command (op code 21) returns the data that are set by the MODE SELECT command. If the command received is not one of the above, the command is ignored.

Figure 18:
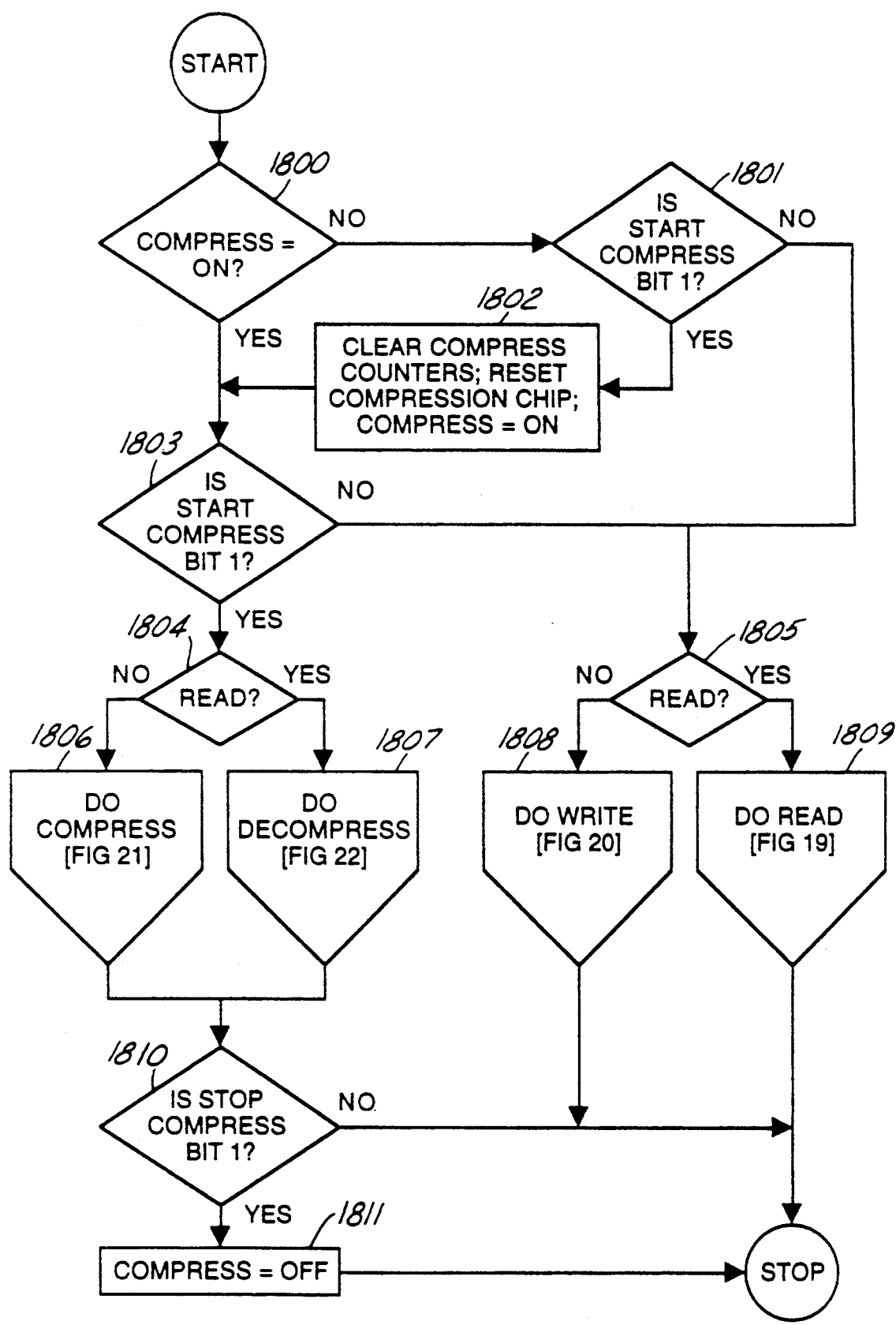
FIG. 18 is a flowchart covering the interpretation of sector I/O commands by the present invention (referenced in FIG. 15).

FIG. 18 is a high level flow chart representing code which is executed when a READ and WRITE command for a device attached to the secondary buss is received. More specifically FIG. 18 details the use of the COMPRESS internal variable and the START and STOP compression bits. Compression is a sequential process where data is examined and a translation dictionary is constructed "on-the-fly". The translation dictionary and the compressed data are necessary for the correct reconstruction of the file. Given a single compression chip, or a compression chip which can only work on one input steam (as is the case with the preferred embodiment), once compression is started, the data sent to the compressor cannot be interrupted by other data. Thus once a file has begun to be compressed, it must be compressed in its entirety before any other data can be compressed. However, since files must often be read or written with multiple SCSI read or write commands (see the example in FIG. 14, and discussion of FIG. 14), the preferred embodiment must allow a write to interrupt a read with decompression, or a read to interrupt a write with compression. And in host computers which support the use of virtual memory, the compression and decompression process can be interrupted with both reads and writes, since the code which is processing a file on the host computer may generate a page fault requiring access to the mapped memory on the disk (the mapped or virtual memory on the disk is assumed to be uncompressed). The method disclosed in FIG. 18 solves this problem. The internal COMPRESS variable is initialized to off (FIG. 15). When a READ or WRITE command is received, the state of the COMPRESS variable is first tested (test 1800). If COMPRESS is ON, then compression is assumed to be in progress. If compression is ON and the start compress bit is ON (YES branch on test 1803) then the READ or WRITE command is assumed to be the next in the compression or decompression sequence, and the compression and decompression are covered in FIGS. 21 and 22 and the discussion thereof. If compression is ON and the start compress bit is OFF (NO branch on test 1803), then the READ or WRITE is assumed to be one "interrupting" the compression process. The READ or WRITE is routed through the present invention without interfering with the compression process (details covered in FIGS. 19 and 20 and the discussion thereof). If COMPRESS is OFF (NO branch on test 1800), and if the START compress bit is set (YES branch on test 1801), then the present command is assumed to be the FIRST in a compression or decompression sequence and the compression chip is set up accordingly and the COMPRESS variable is set to ON (step 1802). If COMPRESS is OFF and the START compress bit is not set then the command is assumed to be a normal READ or WRITE. Finally, if the STOP compression bit is set (as well as the start compress bit), then the command is assumed to be the last in a compression or decompression sequence, and the COMPRESS variable is turned off and the compression chip is reset.

Before a READ (or WRITE) command can be executed, tests must first be made to see if the ID of the secondary device is an ID which is part of a virtual device or a RAID group. This test is done by cross-referencing the secondary ID with all of the possible virtual or RAID groups defined in the configuration table. If the ID is one which belongs to a virtual device then the device which must be accessed is a function of the LBA (logical block address) in the read command. For example suppose we have a three disk virtual device with the following virtual LBA mapping stored in the virtual device mapping table:

| SCSI ID | 1st mapped sector | virtual LBA low | virtual LBA high |
|---------|-------------------|-----------------|------------------|
| 0 | 10 | 0 | 99,999 |
| 1 | 20 | 100,000 | 199,999 |
| 2 | 8 | 200,00 | 299,999 |

If the command starts at virtual device LBA 150,000 then the secondary device to be accessed has an ID of 1, and the "READ" device LBA is (150,000−100,000)+20, or 50,020. This value must be substituted into the LBA in place of the 150,000 and the Device ID must be changed to 1. If the ID belongs to a RAID group, the sectors involved in the transfer must be scrambled or unscrambled depending upon the direction of the data transfer. The preferred embodiment of the present invention implements RAID groups by striping the sectors across the drives in the group. However in the RAID group, sectors are organized sequentially across the disks. This means, for example, that if four drives plus one parity drive are in the group the logical sectors in the virtual RAID drive are sequenced as follows (where $\pi$ represents the parity function):

| DRIVE 1 | DRIVE 2 | DRIVE 3 | DRIVE 4 | PARITY DRIVE |
|---------|---------|---------|---------|--------------|
| 0,4,8,12 ... | 1,5,9,13 ... | 2,6,10,14 ... | 3,7,11,15 ... | $\pi(0,1,2,3)$, $\pi(4,5,6,7)$, $\pi(8,9,10,11)$, $\pi(12,13,14,15)$ ... |

Each of the parallel sectors stored in the disk array is exclusive or'd together to generate a parity sector. Each bit in each byte on the parity sector then represents the parity of the corresponding bits in each of the corresponding bytes in the parallel drives. For example if the following bytes were the first bytes in sectors 0,1,2, and 3 of the above example, they would then generate the following parity in the first byte of the parity sector.

| DRIVE 1 | DRIVE 2 | DRIVE 3 | DRIVE 4 | PARITY DRIVE |
|---------|---------|---------|---------|--------------|
| 0011 0011 | 1010 1010 | 1110 0001 | 0001 1000 | 0110 0000 |

To the host software, the RAID group looks like a single drive and sectors are sent in order. Before they are written, the data must be scrambled, or reorganized into the above groupings, so that each drive can be sent what to it is a sequential set of sectors. When a RAID group is read, the data must be unscrambled before it is sent to the host computer.

Figure 19:
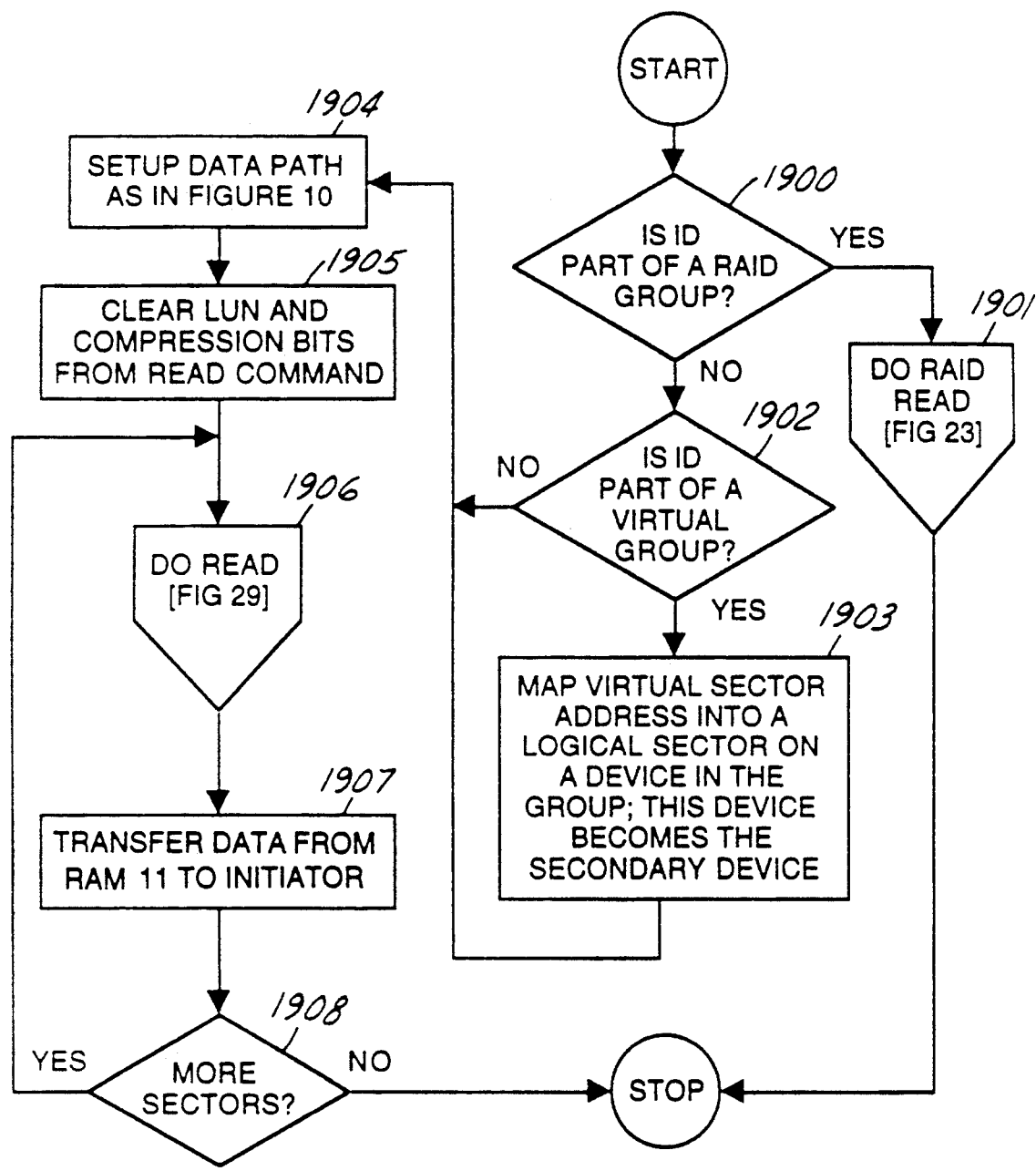
FIG. 19 is a flowchart covering the interpretation of read commands by the present invention (referenced in FIG. 18).

FIG. 19 discloses more details of READ command processing. If the ID belongs to a RAID group (YES branch on test 1900), it is handled differently from a non-RAID READ and the procedure is disclosed in FIG. 23. If the ID belongs to a virtual device (YES branch to test 1902) the READ command is rewritten according to the above discussion and the secondary device ID is remapped (step 1903). Once this is done the READ command is handled in the usual manner: the present invention buss structure is set up for the READ command (step 1904), the LUN and compression bits are stripped (step 1905), data up to the buffering limit on the preferred embodiment is transferred from the device and stored (step 1906). Details of the READ operation are disclosed in FIG. 29. Finally the data is retransmitted from internal storage means to the initiator on the primary buss (step 1907). Steps 1906–1907 are repeated until no more data remains (test 1908).

Figure 20:
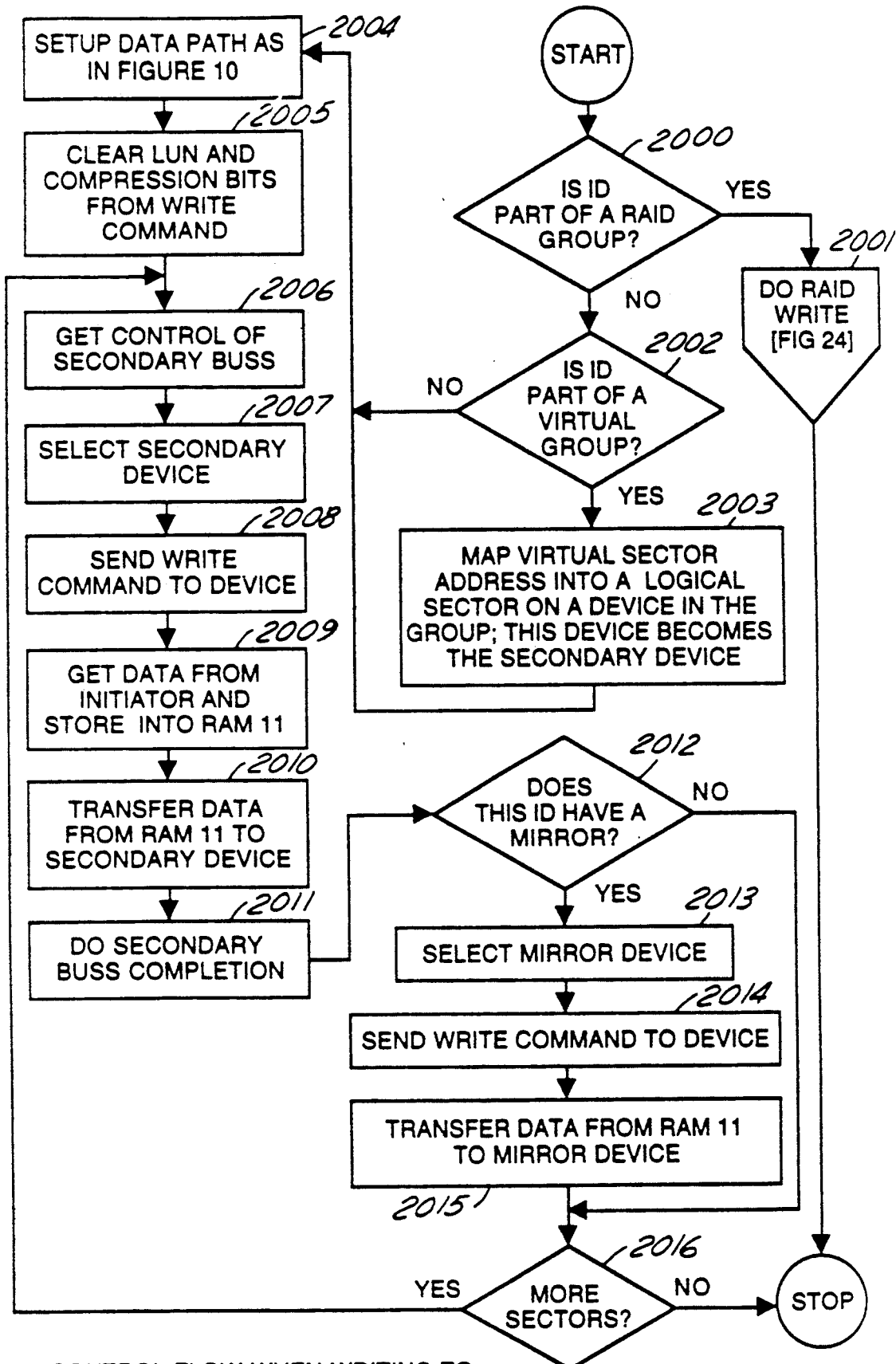
FIG. 20 is a flowchart covering the interpretation of write commands by the present invention (referenced in FIG. 18).

FIG. 20 discloses more details of WRITE command processing. If the ID belongs to a RAID group (YES branch on test 2000), it is handled differently from a non-RAID WRITE and the procedure is disclosed in FIG. 24. If the ID belongs to a virtual device (YES branch to test 2002) the WRITE command is rewritten according to the method disclosed preceding the discussion of the read command (FIG. 19) and the secondary device ID is remapped (step 2003). Once this is done the WRITE command is handled in the usual manner: the present invention buss structure is set up for the WRITE command (step 2004), the LUN and compression bits are stripped (step 2005), control of the secondary buss is gained (step 2006), the secondary device is selected (step 2007), the WRITE command is sent to the device (step 2008), data up to the buffering limit of the preferred embodiment is received from the initiator on the primary buss and stored (step 2009), and the data is retransmitted from internal storage means to the device on the secondary buss (step 2010), and the secondary buss sequence is ended with status/message phase (step 2011). Once the WRITE command is executed, the configuration table is checked to see if the device is mirrored (test 2012). If it is then the data written to the original device is written to the mirror device (steps 2013–2015).

Figure 21:
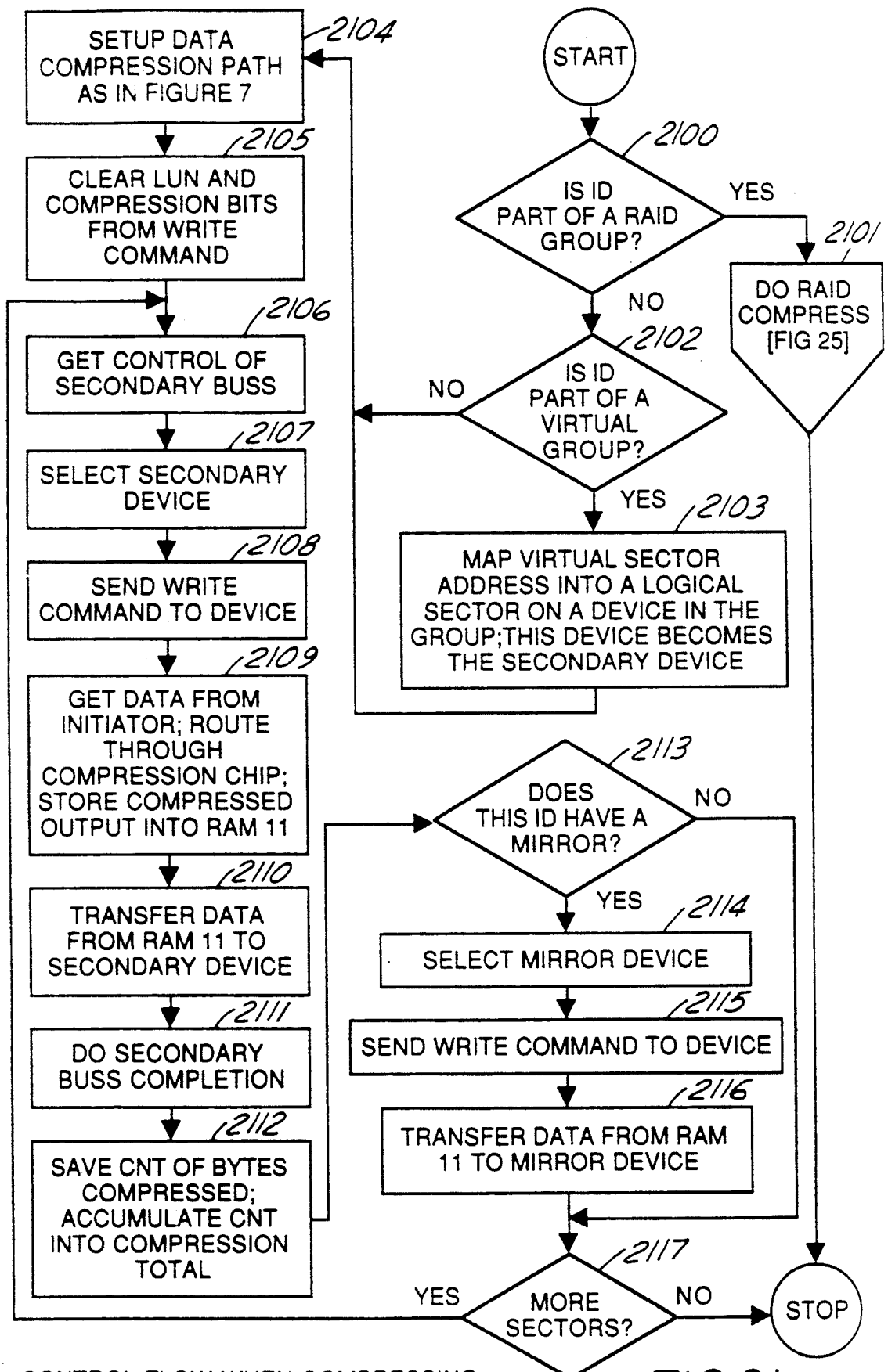
FIG. 21 is a flowchart covering the interpretation of compression commands by the present invention (referenced in FIG. 18).

FIG. 21 discloses more details of WRITE command processing with compression. If the ID belongs to a RAID group (YES branch on test 2100), it is handled differently from a non-RAID READ and the procedure is disclosed in FIG. 25. If the ID belongs to a virtual device (YES branch to test 2102) the WRITE command is rewritten according to the method disclosed preceding the discussion of the READ command (FIG. 19) and the second device ID is remapped (step 2103). Once this is done the WRITE command is handled in the usual manner: the present invention buss structure is set up for the WRITE command with data compression (step 2104), the LUN and compression bits are stripped (step 2105), control of the secondary buss is gained (step 2106), the secondary device is selected (step 2107), the WRITE command is sent to the device (step 2108), data up to the buffering limit of the preferred embodiment is received from the initiator on the primary buss, compressed by compression chip 12, and stored (step 2109), and the data is retransmitted from internal storage means to the device on the secondary buss (2110), and the secondary buss sequence is ended with status/message phase (step 2111). Statistics on the compression are stored (step 2112). Once the WRITE command is executed, the configuration table is checked to see if the device is mirrored (test 2113). If it is then the data written to the original device is written to the mirror device (steps 2114-2116). Steps 2106-2116 are repeated until no more data remains (test 2117).

Figure 22:
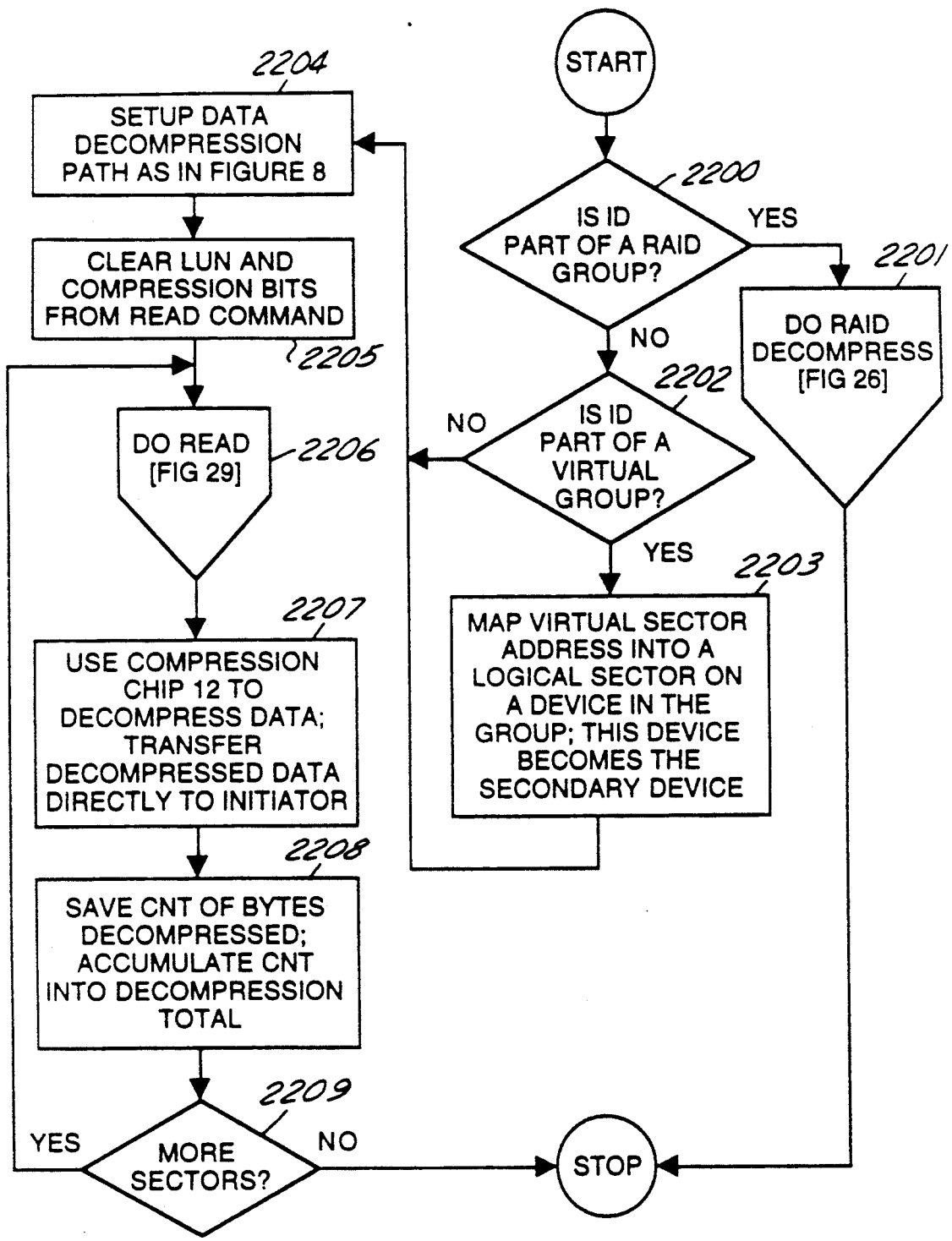
FIG. 22 is a flowchart covering the interpretation of decompression commands by the present invention (referenced in FIG. 18).

FIG. 22 discloses more details of READ command processing with decompression. If the ID belongs to a RAID group (YES branch to test 2200), it is handled differently from a non-RAID READ and the procedure is disclosed in FIG. 26. If the ID belongs to a virtual device (YES branch to test 2202) the READ command is rewritten according to the method disclosed preceding the discussion of the READ command FIG. 19) and the secondary device ID is remapped (step 2203). Once this is done the READ command is handled in the usual manner: the present invention buss structure is set up for the READ command with decompression (step 2205), the LUN and compression bits are stripped (step 2205), data up to the buffering limit of the preferred embodiment is transferred from the device and stored (step 2206). Details of the read operation are disclosed in FIG. 29. The data is decompressed by use of decompression means 12 and retransmitted from internal storage means to the initiator on the primary buss (step 2207). Finally statistics on the compression are stored (step 2208). Steps 2206-2208 are repeated until no more data remains (test 2209).

Due to the way data is organized in a RAID group (see above, discussion preceding disclosure on FIG. 19), data in any READ or WRITE will be spread across all of the drives in the RAID group, unless the number of sectors in the transfer is less than the number of drives in the RAID group minus one (for the parity drive). Since the data is spread over a set of drives it is possible to read the drives in parallel, effectively multiplying the transfer rate of the RAID device by the number of drives in the RAID group minus one (for the parity drive). An alternate embodiment of the present invention can support this maximum parallelism by adding a plurality of RAM chips 11 and SCSI chips 6, one for each possible attached device (seven RAMs and seven SCSI chips altogether). The embodiment shown in FIG. 5-11 does not support this degree of parallelism. However, data transfer to and from a group of RAID devices is accomplished by the present invention through a scheme which uses OVERLAPPED seeks. This scheme allows seeks (accessing data on the disks in a RAID devices) to be conducted in parallel (although data is transferred from the RAID devices in the order that the seeks complete). OVERLAPPED SEEKS means that the present invention issues a seek command to each device involved in a transfer, without waiting for the seek to complete, so that all of the drives begin their seeks within a few microseconds of each other.

Figure 23:
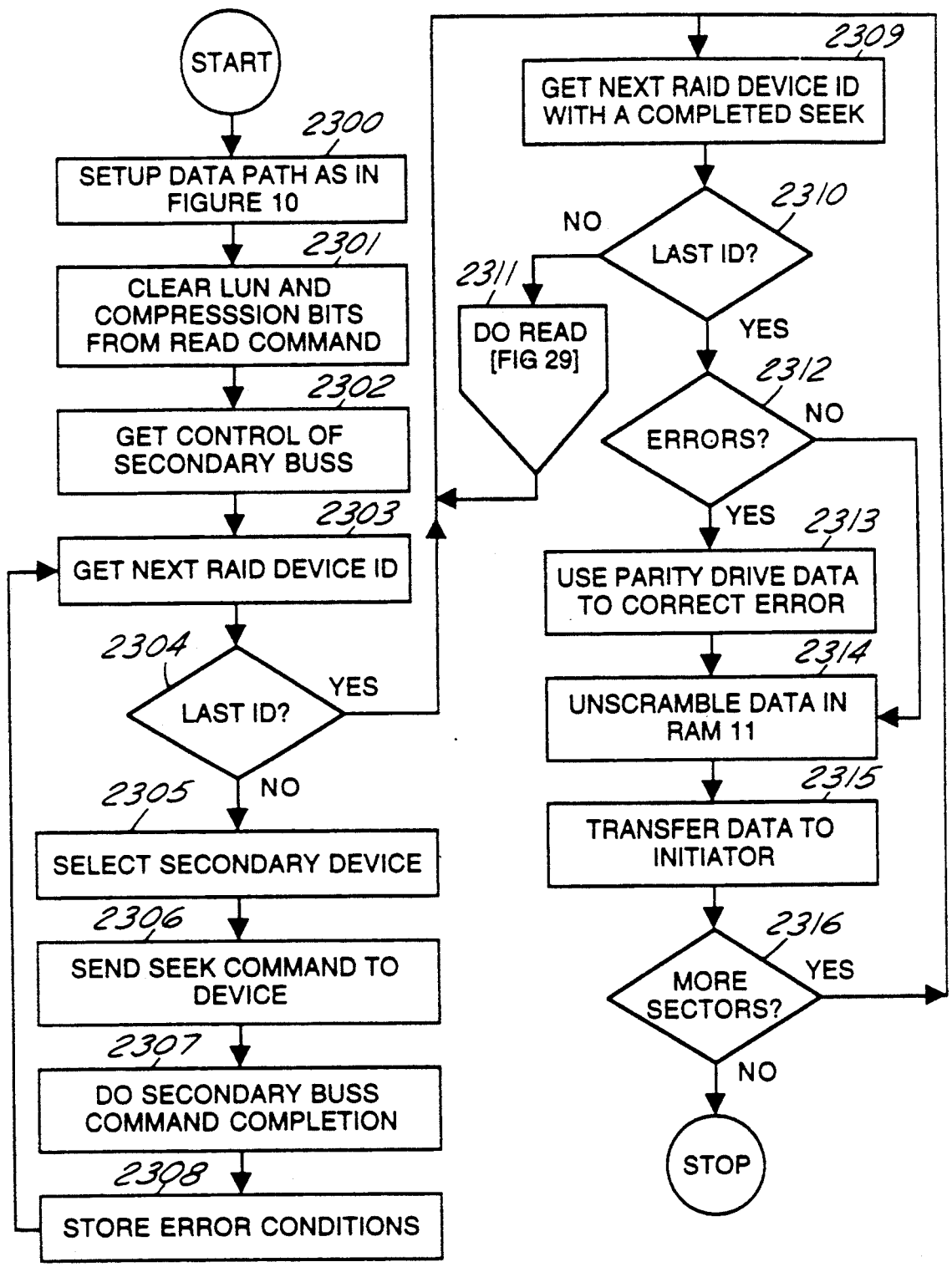
FIG. 23 is a flowchart covering the interpretation of read commands sent to a RAID configuration of disks (referenced in FIG. 19).

FIG. 23 discloses the details of READ command processing with a RAID group. The present invention buss structure is set up for the READ command (step 2300), the LUN and compression bits are stripped (step 2301), control of the secondary buss is gained (step 2302). At this point the seek begins. The configuration table is scanned for the next ID in the RAID group (step 2303), if there is a next ID the device with the ID is selected (step 2305), the seek command is sent to the device (step 2306), status/message phase is done (2307) and the status/message bytes are stored (2308). When all of the seeks have been issued, the present invention waits to be interrupted by the drives when the seeks have been completed. As each device reports (step 2309), and as long as all drives have not reported (test 2310), data up to the buffering limit of the preferred embodiment is transferred into RAM 11 (step 2311). Details of the READ operation are disclosed in FIG. 29. At test 2312 the save status/message bytes are examined to see if any drive was unable to be read. If this is the case, the parity sectors equivalent to the read sectors are transferred from the parity drive and the data therein is used to reconstruct the data from the missing drive (step 2313). Once the data has been read correctly it is unscrambled (see discussion preceding that for FIG. 19) in step 2314 and sent to the initiator (step 2315). Steps 2309-2315 are repeated until no more data remains (test 2316).

Figure 24:
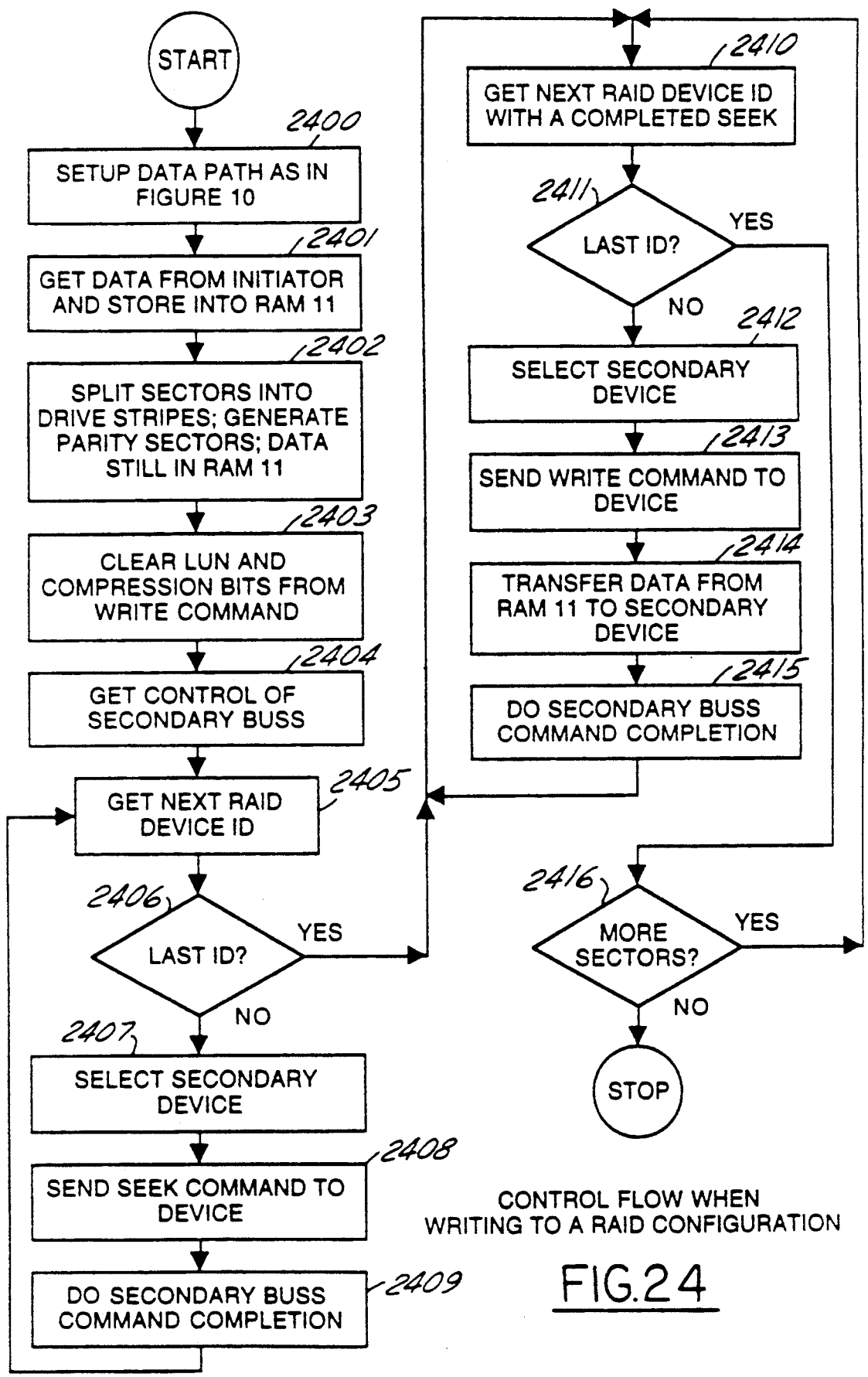
FIG. 24 is a flowchart covering the interpretation of write commands sent to a RAID configuration of disks (referenced in FIG. 20).

FIG. 24 discloses the details of WRITE command processing with a RAID group. First, the present invention buss structure is set up for the WRITE command (step 2400), then, the data is read from the initiator and read into RAM 11 (step 2401). Then, in step 2404, the data is scrambled and parity sectors are generated (see discussion preceding that for FIG. 19). The LUN and compression bits are stripped (step 2403) and control of the secondary buss is gained (step 2404). At this point the seek loop begins. The configuration table is scanned for the next ID in the RAID group (step 2405), if there is a next ID the device with the ID is selected (step 2407), the seek command is sent to the device (step 2408) and status/message phase is done (2409). When all of the seeks have been issued, the present invention waits to be interrupted by the drives when the seeks have been completed. As each drive reports (step 2410), and as long as all drives have not reported (test 2411), the device is selected (step 2412), a WRITE command is sent to the device (step 2413), data up to the buffering limit of the preferred embodiment is transferred from RAM 11 to the secondary device (step 2414) and the status/message phase is completed (step 2415). When all drives have reported, the process is complete. Steps 2410-2415 are repeated until no more data remains (test 2416). The above steps are those used when the number of sectors being written is an even multiple of the number of non-parity drives. Not shown are details of the processing when the number of sectors to be written is not an even multiple of the number of non-parity drives. For example, if there are four drives in the RAID group, with one additional parity drive, and only three sectors are being written, then the "missing" sector must be read in order to build the proper parity sector on the parity drive. In general, if the number of sectors being written is not an even multiple of the number of non-parity drives, then, before the final parity sector is written, a number of sectors equal to the remainder of the number of sectors in the request divided by the number of non-parity drives and located immediately following the last written sector, must be read and used to compute the last parity sector.

Figure 25:
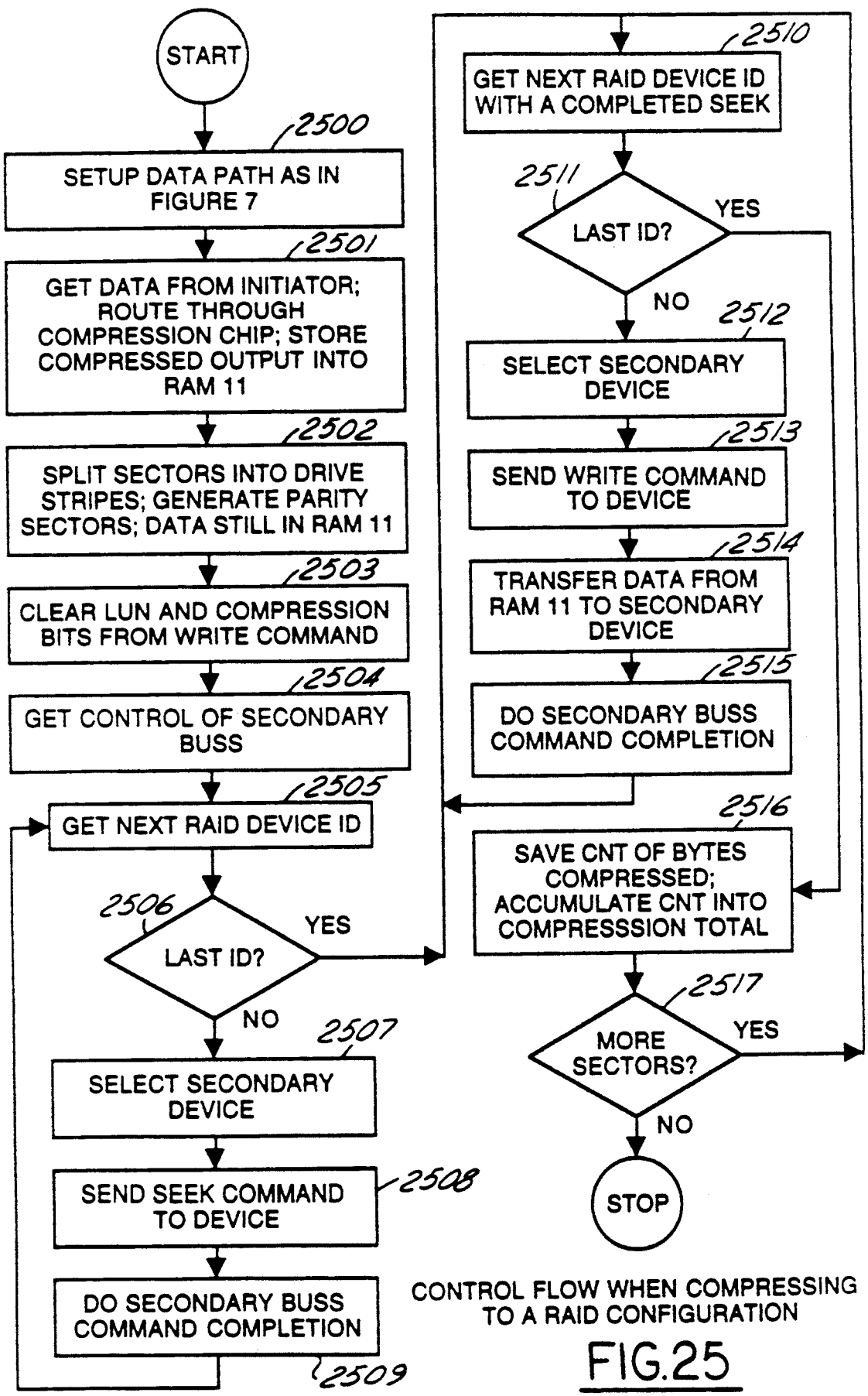
FIG. 25 is a flowchart covering the interpretation of compression commands when writing to a RAID configuration of disks (referenced in FIG. 21).

FIG. 25 discloses the details of WRITE command processing with a RAID group with data compression. First, the present invention buss structure is set up for the WRITE command with data compression (step 2500), the data is read from the initiator, compressed by compression means 12 and stored into RAM 11 (step 2501). Then in step 2502 the data is scrambled and parity sectors are generated (see discussion preceding that for FIG. 19). The LUN and compression bits are stripped (step 2503) and control of the secondary buss is gained (step 2504). At this point the seek begins. The configuration table is scanned for the next ID in the RAID group (step 2505), if there is a next ID the device with the ID is selected (step 2507), the seek command is sent to the device (step 2508) and status/message phase is done (2509). When all of the seeks have been issued, the present invention waits to be interrupted by the drives when the seeks have been completed. As each device reports (step 2510), and as long as all drives have not reported (test 2511), the device is selected (step 2512), a write command is sent to the device (step 2513), data up to the buffering limit of the preferred embodiment is transferred from RAM 11 to the device (step 2514) and the status/message phase is completed (step 2515). When all drives have reported, statistics of the compression are saved (step 2516) the process is complete. Steps 2510-2516 are repeated until no more data remains (test 2517). Not shown are details of the processing when the number of sectors to be written is not an even multiple of the number of non-parity drives. For example, if there are four drives in the RAID group, with one additional parity drive, and only three sectors are being written, then the "missing" sector must be read in order to build the proper parity sector on the parity drive. In general, if the number of sectors being written is not an even multiple of the number of non-parity drives, then, before the final parity sector is written, a number of sectors equal to the remainder of the number of sectors in the request divided by the number of non-parity drives and located immediately following the last written sector, must be read and used to compute the last parity sector.

Figure 26:
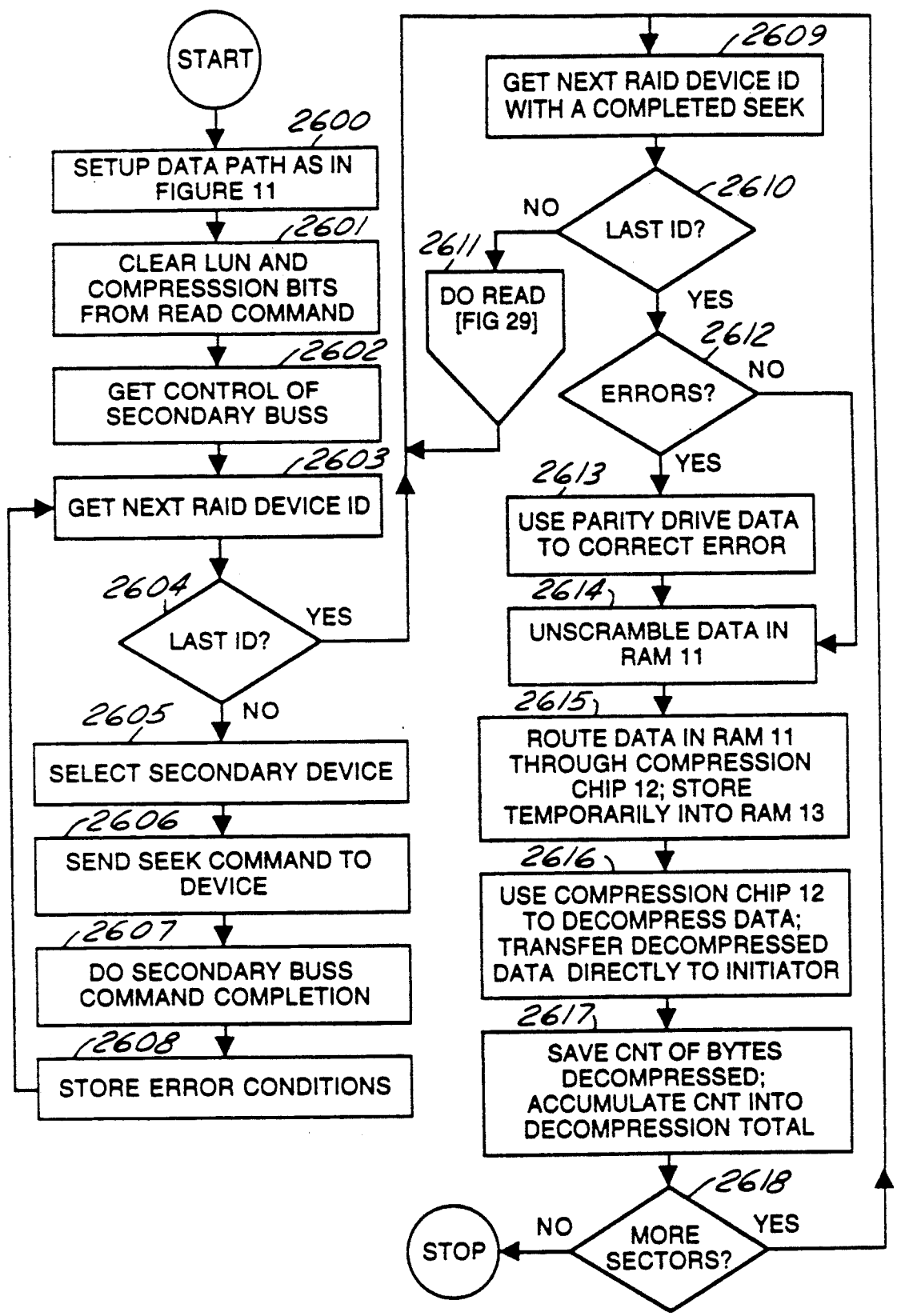
FIG. 26 is a flowchart covering the interpretation of decompression commands when reading from a RAID configuration of disks (referenced in FIG. 22).

FIG. 26 discloses the details of READ command processing with a RAID group with data decompression. First, the present invention buss structure is set up for the READ command with decompression (step 2600), the LUN and compression bits are stripped (step 2601), and control of the secondary table is scanned for the next ID in the RAID group (step 2603), if there is a next ID the device with the ID is selected (step 2605), the seek command is sent to the device (step 2606), status/message phase is done (2607) and the status/message bytes are stored 92608). When all of the seeks have been issued, the present invention waits to be interrupted by the drives when the seeks have been completed. As each device reports (step 2609), and as long as all drives have not reported (test 2610), for each drive data up to the buffering limit of the preferred embodiment is transferred into RAM 11 (step 2611). Details of the read operation are disclosed in FIG. 29. At test 2612 the save status/message bytes are examined to see if any drive was unable to be read. If this is the case, the parity sectors equivalent to the read sectors are transferred from the parity drive and the data therein is used to reconstruct the data from the missing drive (step 2613). Once the data has been read correctly it is unscrambled (see discussion preceding that for FIG. 19) in step 2615. The data is next transferred into RAM 11 used exclusively by the compression chip 12 (step 2614), the data is decompressed by decompression chip 12 and sent to the initiator (step 2616), and finally the decompression statistics are saved (step 2617). Steps 2609-2617 are repeated until no more data remains (test 2618).

Figure 28:
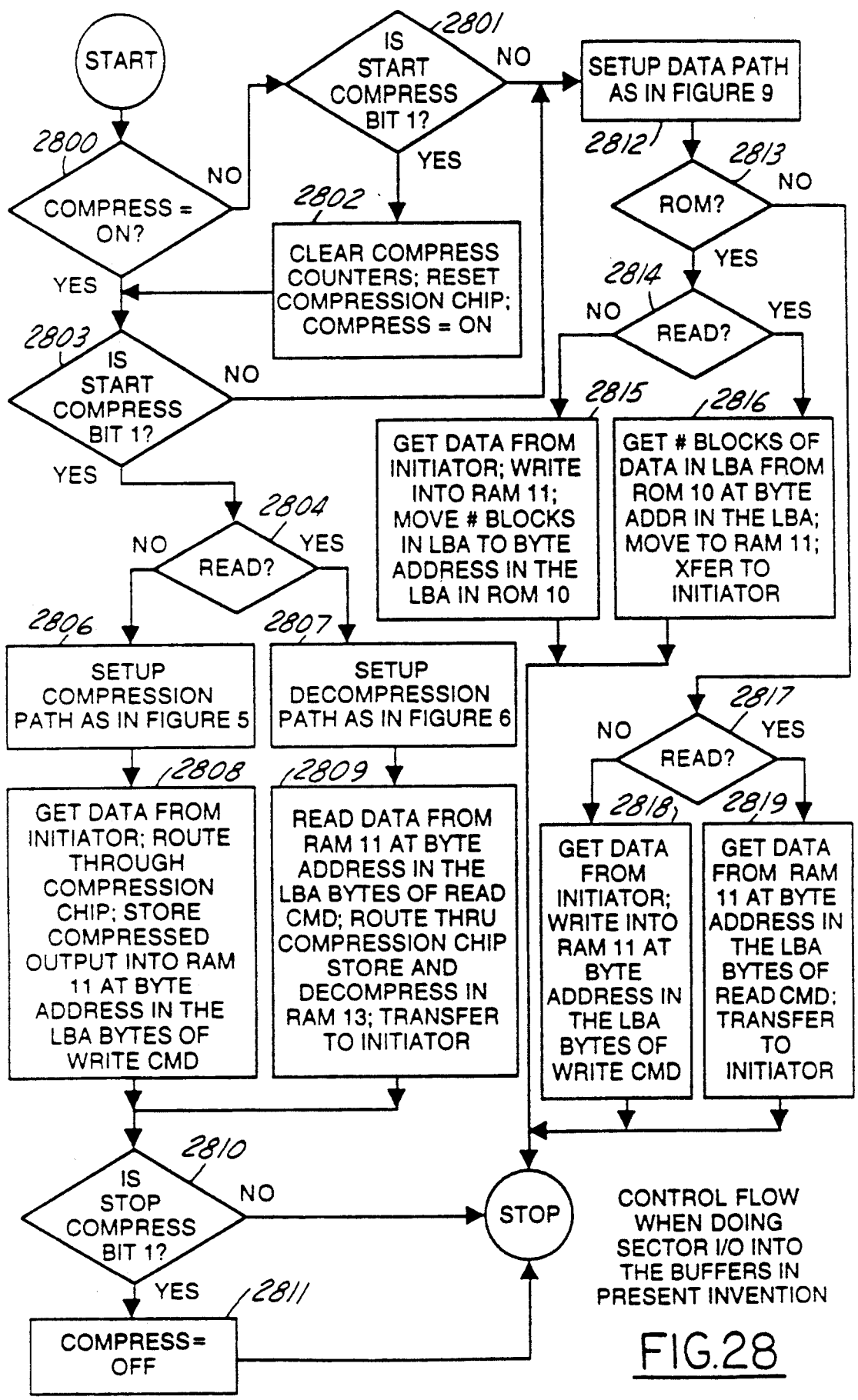
FIG. 28 is a flowchart of the interpretation of read/write commands including compression and decompression sent directly to the present invention by a host computer (referenced in FIG. 18).

FIG. 28 discloses the operation of the present invention when it processes READ and WRITE commands sent directly to it where no data is to be transferred through to the secondary buss (FIG. 28 is referenced from FIG. 17). The internal COMPRESS variable is initialized to off (FIG. 15). When a READ or WRITE command is received, the state of the COMPRESS variable is first tested (test 2800). If COMPRESS is ON, then compression is assumed to be in progress. If compression is ON and the start compress bit is ON (YES branch on test 2803) then the READ or WRITE command is assumed to be the next in compression or decompression sequence, and the compression or decompression is continued. When interpreting READ and WRITE commands for its own use, the present invention interprets the logical block address as logical BYTE address. The byte address is an address in RAM 11 or EPROM 10. RAM 11 and EPROM 10 are addressed in the same 2 megabyte logical (21 bit) address space, therefore RAM 11 or EPROM 10 is chosen by specifying an address in the logical address space which maps to one or the other. This allows the initiator access to the internal memory as if it were a disk with a small number of sectors, while giving the initiator more precise control of placement (at a byte offset rather than a sector offset). In steps 2806 and 2808 the present invention sets up the buss structure for WRITE with compression and then reads data in from the initiator, compresses the data with compression chip 12 and stores the output at the logical byte address specified in the WRITE command. In steps 2807 and 2809 the present invention sets up the buss structure for READ with decompression and then moves data from RAM 11 stored at the byte address specified in the LBA into RAM 13, decompressed the data with decompression chip 12 and transfers the decompressed data to the initiator. If compression is ON and the start compress bit is OFF (NO branch or test 2803), then the READ or WRITE is assumed to be one "interrupting" the compression process, and the data buss is setup accordingly (step 2812). If the READ or WRITE is to an address which is mapped to the electrically alterable EPROM 10 (YES branch on test 2813), then on a READ, (YES branch on test 2814) microprocessor 9 transfers data at the byte address specified (which is mapped into EPROM chip 10) into a buffer in RAM 11 and then the data is transferred from RAM 11 to the initiator (step 2816). On a WRITE (NO branch on test 2814) data is transferred from the initiator into RAM 11 and then microprocessor 9 sets up electrically alterable EPROM 10 for programming, and then transfers the number of blocks of data specified in the command from the buffer in RAM 11 to the byte address mapped into the ROM ("programming" the EPROM) and specified in the LBA. If the READ or WRITE is directly into RAM (NO branch on test 2813) then if it is a READ (YES branch on test 2817), the number of blocks of data specified in the command is moved from RAM 11 at the byte specified to the initiator (step 2819). If it is a WRITE (NO branch on test 2817) then the number of blocks of data specified in the command is transferred from the initiator to the byte in RAM 11 specified in the command (step 2818). If COMPRESS is OFF (NO branch on test 2800), and if the start compress bit is set (YES branch on test 2801), then the present command is assumed to be the FIRST in a compression or decompression sequence and the compression chip is set up accordingly and the COMPRESS variable is set to ON (step 2802). If COMPRESS is OFF and no the start compress bit is not set then the command is assumed to be a normal READ or WRITE (see above, steps 2812 or 2819). Finally, if the stop compression bit is set (as well as the start compress bit), then the command is assumed to be the last in the compression or decompression sequence, and the COMPRESS variable is turned off and the compression chip is reset.

Figure 29:
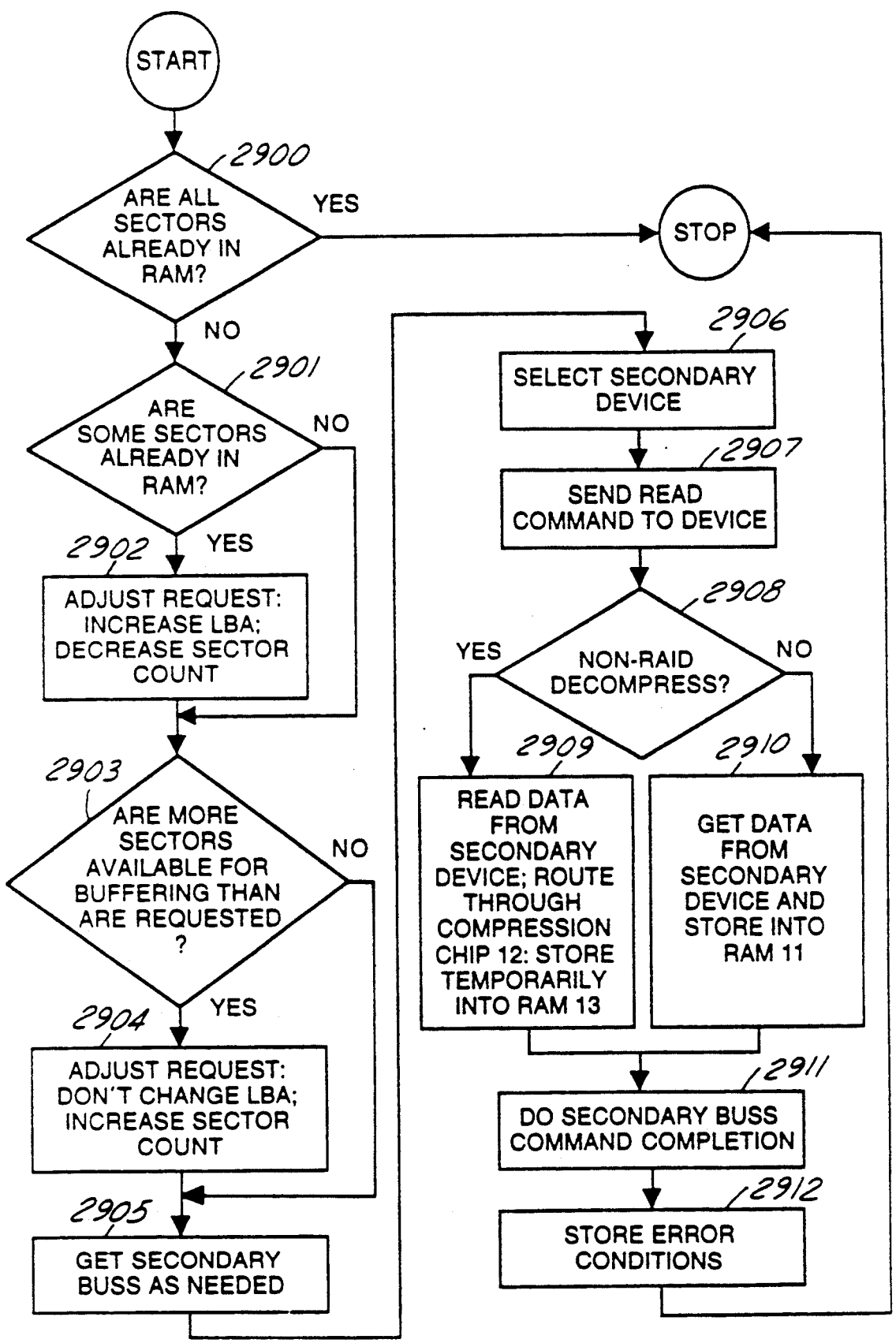
FIG. 29 is a flowchart detailing the read operations (includes read-ahead buffering) of the preferred embodiment of the current invention (referenced in FIG. 29, 22, 23 and 26).

FIG. 29 discloses more details of the READ operation of the preferred embodiment. The preferred embodiment implements read-ahead buffering, a technique which is well known to those skilled in the art. In read-ahead buffering, data is read in up to the buffering limit of the present invention, even when less than the buffering limit has been requested. Subsequent read requests can then be satisfied without accessing the device if the data is already in memory. First, in test 2900, RAM chips 11, 13 are checked to see if the requested data is already in memory. If it is, then the READ command is considered completed and no secondary SCSI device needs to be accessed. If part of the requested data is already in memory (YES branch on test 2901) then the READ command is adjusted by increasing the LBA (logical block address), and decreasing the sector count by the number of sectors already in RAM (step 2902). Test 2903 compares the number of requested sectors to the number of sectors that can be buffered. If the number of requested sectors is less than the amount that can be buffered (YES branch on test 2903), the sector count is increased so that is equals the number of sectors that can be buffered (step 2904). Once the read command has been adjusted to reflect the state of the buffers in the preferred embodiment, the READ command is handled in the usual manner: control of the secondary buss is gained (if it has not already been done (step 2905)), the secondary device is selected (step 2906), the READ command is sent to the device (step 2907), if the command is for a non-RAID group READ with decompress (YES branch on test 2910, as in FIG. 22), then data up to the buffering limit of the preferred embodiment is transferred from the device and stored in RAM 13 (step 2909), or otherwise stored into RAM 11 (step 2910). Status/message phase is then completed for the secondary buss (step 2911) and any error conditions are stored (step 2912).

From the foregoing, it will be appreciated that a novel Data Buss Interface and Expansion System is disclosed which not only provides for accomplishing the objectives of the invention, but does so in a particularly effective and reliable manner. It is recognized that those skilled in the art may make various modifications or additions to the preferred embodiments chosen here to illustrate the present invention, without departing from the spirit of the present invention. Accordingly, it is to be understood that the protection sought to be afforded hereby should be deemed to extend to the subject matter claimed in all equivalents thereof fairly within the scope of the invention.

What is claimed is:

1. A buss expansion apparatus for expanding the number of devices which are accessible to a fixed capacity, primary peripheral data buss of a host computer, said apparatus being responsive to a predetermined buss protocol to communicate with devices joined along a secondary peripheral data buss, said devices being responsive to said predetermined buss protocol wherein said host computer is defined as an initiator and at least one of said devices joined along said secondary peripheral data bus is defined as a target, said apparatus comprising:

means operatively connected with said fixed capacity, primary peripheral data bus for receiving said predetermined buss protocol from said initiator device, said predetermined buss protocol including information identifying said target device, means operatively connected with said receiving means, for determining if said target device is joined along said secondary peripheral data buss, means operatively connected with said secondary peripheral data buss and said determining means for passing data, according to said predetermined buss protocol, between said target device joined along said secondary peripheral data buss and said initiator device joined along said fixed capacity, primary peripheral data buss.

2. The apparatus of claim 1, further including means operatively connected with at least one of said receiving means, determining means, and passing means, for buffering said data transferred between said target device joined along said secondary peripheral data buss and said initiator device joined along said primary peripheral data buss.

3. The apparatus of claim 2, wherein said buffering means also includes means for buffering data transferred between at least two devices joined along said primary peripheral data buss.

4. The apparatus of claim 1, further including means, operatively connected with at least one of said receiving means, determining means, and passing means, for compressing said data transferred between said target device joined along said secondary peripheral data buss and said initiator device joined along said primary peripheral data buss.

5. The apparatus of claim 4, wherein said compressing means includes means for compressing data transferred between at least two devices joined along said primary peripheral data buss.

6. The apparatus of claim 4, further including decompressing means operatively connected with said compressing means, said decompressing means for decompressing data transferred between said target device joined along said secondary peripheral data buss and said initiator device joined along said primary peripheral data buss.

7. The apparatus of claim 5, further including decompressing means operatively connected with said compressing means, said decompressing means for decompressing data transferred between at least two devices joined along said primary peripheral data buss.

8. The apparatus of claim 1, further including drive configuration means operatively connected with at least one of said receiving means, determining means, and passing means for configuring at least two of said devices joined along said secondary peripheral data buss into a mirror device configuration.

9. The apparatus of claim 1, further including drive configuration means operatively connected with at least one of said receiving means, determining means, and passing means for configuring at least two of said devices joined along said secondary peripheral data buss into a virtual device configuration.

10. The apparatus of claim 1, further including drive configuration means operatively connected with at least one of said receiving means, determining means, and passing means for configuring at least three of said devices joined along said secondary peripheral data buss into a RAID device configuration.

11. A data compressing and decompressing peripheral device, said compressing and decompressing peripheral device being one of a plurality of peripheral devices joined along a primary peripheral data buss, said plurality of peripheral devices being responsive to a predetermined buss protocol communicated over said primary peripheral data buss wherein at least one of said peripheral devices is defined as an initiator, and at least one of said peripheral devices other than said initiator is defined as a target, said data compressing and decompressing peripheral device comprising:

means operatively connected with said primary peripheral data buss for receiving said predetermined buss protocol from said initiator device, means for compressing and decompressing data, means operatively connected with said primary peripheral data buss and said compressing and decompressing means for receiving said predetermined buss protocol from said initiator device, said predetermined protocol including compression control information and target information, said compression control information commanding the enabling and disabling of said compressing and decompressing means and said target information identifying which of said peripheral devices is defined as said target device, means responsive to said information within said predetermined protocol for accepting data presented along said primary peripheral data buss and transferring said data to said compressing and decompressing means for processing thereby, wherein said data is compressed or decompressed in response to said compression control information, means for transferring said data processed by said compressing and decompressing means to said target device wherein said transferring of data is done according to said predetermined buss protocol.

12. The device of claim 11, further including means, operatively connected with a secondary peripheral data buss, for transferring said data processed by said compressing and decompressing means to said target device, wherein said target device includes one or more peripheral devices joined along said secondary peripheral data buss, wherein said transferring means transfers said processed data according to said predetermined buss protocol.

13. The device of claim 12, further including drive configuration means for configuring at least two of said peripheral devices joined along said secondary peripheral data buss into a mirror device configuration.

14. The device of claim 12, further including drive configuration means for configuring at least two of said devices joined along said secondary peripheral data buss into a virtual device configuration.

15. The device of claim 12, further including drive configuration means for configuring at least three of said devices joined along said secondary peripheral data buss into a RAID device configuration.

16. The device of claim 11, further including means for buffering said data accepted along said primary peripheral data buss.

17. The device of claim 11, further including means for buffering said data process by said compressing and decompressing means.

18. The device of claim 12, further including means for buffering data accepted along said secondary peripheral data buss.

19. A method of expanding a fixed capacity, primary peripheral data buss of a host computer such that the number of devices accessible to said host computer include devices joined along a secondary peripheral data buss, said devices being responsive to a predetermined buss protocol wherein at least one of said devices joined along said fixed capacity, primary peripheral data buss is defined as an initiator and at least one of said devices joined along said secondary peripheral data buss is defined as a target, said method comprising the steps of:

(A) receiving said predetermined buss protocol from said initiator device, said predetermined buss protocol including information identifying said target device, (B) determining if said target device is joined along said secondary peripheral data buss, (C) in response to an affirmative determination in step (B), passing data, according to said predetermined buss protocol, between said target device joined along said secondary peripheral data buss and said initiator device joined along said fixed capacity, primary peripheral data buss.

20. The method of claim 19, further including the step of (D) buffering said data transferred between said target device and said initiator device.

21. The method of claim 20, further including the step of (E) buffering data transferred between at least two devices joined along said primary peripheral data buss.

22. The method of claim 19, further including the step of (D) compressing said data transferred between said target device and said initiator device.

23. The method of claim 22, further including the step of (E) compressing data transferred between at least two devices joined along said primary peripheral data buss.

24. The method of claim 22, further including the step of (E) decompressing data transferred between said target device and said initiator device.

25. The method of claim 23, further including the step of (F) decompressing data transferred between at least two devices joined along said primary peripheral data buss.

26. The method of claim 19, further including the step of:

configuring at least two of said devices joined along said secondary peripheral data buss into a mirror device configuration.

27. The method of claim 19, further including the step of:

configuring at least two of said devices joined along said secondary peripheral data buss into a virtual device configuration.

28. The method of claim 19, further including the step of:

configuring at least three of said devices joined along said secondary peripheral data buss into a RAID device configuration.

29. A method of compressing and decompressing data present on a primary peripheral data buss, said primary peripheral data buss supporting a plurality of peripheral devices joined along said primary peripheral data buss, said plurality of peripheral devices being responsive to a predetermined buss protocol communicated over said primary peripheral data buss wherein at least one of said peripheral devices is defined as an initiator, and at least one of said peripheral devices is defined as a target, said method comprising the steps of:

(A) receiving said predetermined buss protocol from said initiator device, said predetermined protocol including compression control information and target information, said target information identifying which of said peripheral devices is defined as said target device, (B) determining, in response to said compression control information, if data compressing or data decompressing is commanded, (C) in response to the determination mode in step (B), accepting data presented along said primary peripheral data buss and processing said data so as to compress or decompress said data, wherein said data is compressed or decompressed in response to said compression control information, and (D) transferring said data processed in step (C) to said target device, said transferring done according to said predetermined protocol.

30. The method of claim 29, wherein said transferring step (D) further includes the step of:

(E) transferring said data processed in step (C) to said target device, wherein said target device includes one or more peripheral devices joined along a secondary peripheral data buss.

31. The method of claim 30, further including the step of configuring at least two of said peripheral devices joined along said secondary peripheral data buss into a mirror device configuration.

32. The method of claim 30, further including the step of configuring at least two of said devices joined along said secondary peripheral data buss into a virtual device configuration.

33. The method of claim 30, further including the step of configuring at least three of said devices joined along said secondary peripheral data buss into a RAID device configuration.

34. The method of claim 29, further including the step of buffering said data accepted along said primary peripheral data buss.

35. The method of claim 29, further including the step of buffering said data processed by said compressing and decompressing means.

36. The method of claim 30, further including the step of buffering data accepted along said secondary peripheral data buss.

37. A method of using a host computer to communicate with a perhipheral device attached to a primary peripheral data buss of said host computer, said peripheral device capable of compressing and decompressing data present on said primary peripheral data buss, said primary peripheral data buss supporting a plurality of peripheral devices joined along said primary peripheral data buss, said plurality of peripheral devices being responsive to a predetermined buss protocol communicated over said primary peripheral data buss wherein at least one of said peripheral devices is defined as a target, said method comprising the steps of:

(A) using said host computer to send information to said compressing and decompressing peripheral device, said information conforming to said predetermined buss protocol, said predetermined protocol including compression control information and target information, said target information identifying which of said peripheral devices is defined as said target device, (B) using said compressing and decompressing peripheral device for determining, in response to said compression control information, if data compressing or data decompressing is commanded, (C) in response to the determination made in step (B), using said compressing and decompressing peripheral device for transferring data from said target device to said compressing and decompressing peripheral device and processing said data so as to compress or decompress said data, wherein said data is compressed or decompressed in response to said compression control information, and (D) using said compressing and decompressing peripheral device for transferring to said host computer, said data processed in step (C), said transferring done according to said predetermined protocol.

38. The method of claim 37, wherein said transferring step (D) further includes the step of:

(E) transferring said data processed in step (C) to said target device, wherein said target device includes one or more peripheral devices joined along a secondary peripheral data buss.

39. The method of claim 37, further including the step of transferring from said host computer to said target device said processed data transferred in step (D).

40. The method of claim 37, wherein step (D) includes the sub-steps of:

(i) transferring a first portion of said processed data to said host computer, (ii) querying said compressing and decompressing device for a compression statistic, (iii) using said compression statistic to determine the size of a second portion of said processed data, and (iv) transferring said second portion of said processed data to said host computer.

41. The method of claim 38, further including the step of configuring at least two of said peripheral devices joined along said secondary peripheral data buss into a mirror device configuration.

42. The method of claim 38, further including the step of configuring at least two of said devices joined along said secondary peripheral data buss into a virtual device configuration.

43. The method of claim 38, further including the step of configuring at least three of said devices joined along said secondary peripheral data buss into a RAID device configuration.

44. The method of claim 37, further including the step of buffering said data accepted along said primary peripheral data buss.

45. The method of claim 37, further including the step of buffering said data processed by said compressing and decompressing peripheral device.

46. The method of claim 38, further including the step of buffering data transferred in step (C).

* * * * *